United States Patent
Lidsky et al.

(10) Patent No.: US 10,559,559 B2
(45) Date of Patent: Feb. 11, 2020

(54) INTEGRATED PROTECTION DEVICES WITH MONITORING OF ELECTRICAL CHARACTERISTICS

(71) Applicant: Volterra Semiconductor Corporation, Fremont, CA (US)

(72) Inventors: David Lidsky, Oakland, CA (US); Ognjen Djekic, San Francisco, CA (US); Ion Elinor Opris, San Jose, CA (US); Budong You, Fremont, CA (US); Anthony J. Stratakos, Berkeley, CA (US); Alexandr Ikriannikov, Castro Valley, CA (US); Biljana Beronja, Palo Alto, CA (US); Trey Roessig, Palo Alto, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

(21) Appl. No.: 15/598,037

(22) Filed: May 17, 2017

(65) Prior Publication Data
US 2017/0256532 A1    Sep. 7, 2017

Related U.S. Application Data

(63) Continuation of application No. 13/453,739, filed on Apr. 23, 2012, now Pat. No. 9,679,885.
(Continued)

(51) Int. Cl.
*H01L 27/02* (2006.01)
*H02H 3/18* (2006.01)
(Continued)

(52) U.S. Cl.
CPC ......... *H01L 27/0266* (2013.01); *H02H 3/087* (2013.01); *H02H 3/18* (2013.01);
(Continued)

(58) Field of Classification Search
CPC .... H01L 27/0266; H02H 3/087; H02H 3/202; H02H 3/42; G01R 19/16552
(Continued)

(56) References Cited

U.S. PATENT DOCUMENTS

| 4,932,246 A | * | 6/1990 | Deutsch ............... G01R 31/007 73/114.45 |
| 5,528,446 A | | 6/1996 | Sankaran et al. |

(Continued)

FOREIGN PATENT DOCUMENTS

| JP | 2002-135965 | 5/2002 |
| TW | 200709527 A | 3/2007 |

(Continued)

OTHER PUBLICATIONS

U.S. Office Action dated Apr. 28, 2015 issued in U.S. Appl. No. 13/453,739.
(Continued)

*Primary Examiner* — Jared Fureman
*Assistant Examiner* — Emmanuel Dominique
(74) *Attorney, Agent, or Firm* — Weaver Austin Villeneuve & Sampson LLP

(57) ABSTRACT

Disclosed are systems, devices, circuits, components, mechanisms, and processes in which a switching mechanism can be coupled between components. The switching mechanism is configured to have an on state or an off state, where the on state allows current to pass along a current path. A monitoring mechanism has one or more sensing inputs coupled to sense an electrical characteristic at the current path. The electrical characteristic can be a current, voltage, and/or power by way of example. The monitoring mechanism is configured to output a reporting signal indicating the sensed electrical characteristic. The monitoring mechanism can be integrated with the switching mechanism on a chip.

17 Claims, 19 Drawing Sheets

Related U.S. Application Data

(60) Provisional application No. 61/478,856, filed on Apr. 25, 2011.

(51) Int. Cl.
*H02H 3/087* (2006.01)
*H02H 3/20* (2006.01)
*H02H 3/42* (2006.01)
*G01R 19/165* (2006.01)

(52) U.S. Cl.
CPC .............. *H02H 3/202* (2013.01); *H02H 3/42* (2013.01); *G01R 19/16552* (2013.01); *Y10T 307/826* (2015.04); *Y10T 307/832* (2015.04); *Y10T 307/858* (2015.04); *Y10T 307/865* (2015.04)

(58) Field of Classification Search
USPC ........................................................ 307/126
See application file for complete search history.

(56) References Cited

U.S. PATENT DOCUMENTS

| | | | |
|---|---|---|---|
| 5,892,407 A | 4/1999 | Ishii | |
| 6,108,183 A * | 8/2000 | Beene | H04M 3/18 361/103 |
| 6,373,671 B1 | 4/2002 | Watanabe et al. | |
| 6,600,362 B1 * | 7/2003 | Gavrila | G05F 3/262 327/427 |
| 6,812,782 B2 | 11/2004 | Grant | |
| 7,265,958 B2 | 9/2007 | Souma | |
| 7,535,690 B2 | 5/2009 | Fan et al. | |
| 7,719,812 B2 | 5/2010 | Phadke et al. | |
| 8,004,113 B2 * | 8/2011 | Sander | H02J 7/35 307/46 |
| 9,679,885 B2 | 6/2017 | Lidsky et al. | |
| 2001/0017489 A1 | 8/2001 | Inoue et al. | |
| 2002/0015272 A1 | 2/2002 | Hattori | |
| 2002/0196644 A1 | 12/2002 | Hwang | |
| 2005/0073786 A1 * | 4/2005 | Turnbull | B60R 1/088 361/93.1 |
| 2005/0134189 A1 | 6/2005 | Osame et al. | |
| 2006/0012932 A1 | 1/2006 | Kitagawa | |
| 2006/0164065 A1 * | 7/2006 | Hoouk | G05F 1/67 324/76.17 |
| 2008/0048500 A1 * | 2/2008 | Kihara | H02J 1/06 307/80 |
| 2008/0284253 A1 | 11/2008 | Stenfert Kroese et al. | |
| 2009/0195190 A1 | 8/2009 | Fong et al. | |
| 2009/0257164 A1 * | 10/2009 | Ikeuchi | G01K 7/01 361/91.5 |
| 2009/0289564 A1 * | 11/2009 | Johnsen | H05B 41/2883 315/224 |
| 2009/0296427 A1 * | 12/2009 | Djenguerian | H02M 1/32 363/21.12 |
| 2010/0254058 A1 | 10/2010 | Kirchbaum et al. | |
| 2010/0295381 A1 | 11/2010 | Burger et al. | |
| 2011/0187340 A1 * | 8/2011 | Deval | H02M 3/158 323/285 |
| 2012/0039005 A1 * | 2/2012 | Kanakubo | H02H 3/087 361/59 |
| 2012/0039098 A1 * | 2/2012 | Berghegger | H02M 3/33507 363/21.13 |
| 2012/0099350 A1 * | 4/2012 | Djenguerian | H02M 3/33523 363/49 |
| 2012/0293017 A1 | 11/2012 | Lidsky et al. | |
| 2014/0268454 A1 * | 9/2014 | Turner | H02H 3/20 361/79 |

FOREIGN PATENT DOCUMENTS

| | | | |
|---|---|---|---|
| TW | 2013/10836 | 3/2013 | |
| TW | I549396 | 9/2016 | |
| WO | WO 2004/111665 | 12/2004 | |
| WO | WO 2010/125733 | 11/2010 | |
| WO | WO-2010125733 A1 * | 11/2010 | ............ H02H 3/087 |
| WO | WO/2012/148774 | 11/2012 | |

OTHER PUBLICATIONS

U.S. Notice of Allowance dated Oct. 19, 2015 issued in U.S. Appl. No. 13/453,739.
U.S. Notice of Allowance dated Feb. 15, 2017 issued in U.S. Appl. No. 13/453,739.
International Search Report and Written Opinion issued in International Application No. PCT/US2012/034262, dated Nov. 30, 2012.
Taiwanese Office Action [no translation], dated Dec. 24, 2015, issued in Application No. 101114586.
Lukic, et al. 2007, "Digital Controller for Multi-Phase DC-DC Converters with Logarithmic Current Sharing," PESC IEEE pp. 119-123.

* cited by examiner

INTEGRATED PROTECTION DEVICES WITH MONITORING OF ELECTRICAL CHARACTERISTICS

PRIORITY DATA

This application is a continuation of and claims priority to co-pending and commonly assigned U.S. patent application Ser. No. 13/453,739, titled "Integrated Protection Devices with Monitoring of Electrical Characteristics", by Lidsky et al., filed on Apr. 23, 2012, which claims priority to commonly assigned U.S. Provisional Patent Application No. 61/478,856, titled "Integrated Protection and Control Device with Monitoring and Reporting", by Lidsky et al., filed on Apr. 25, 2011. The entire disclosures of U.S. patent application Ser. No. 13/453,739 and U.S. Provisional Patent Application No. 61/478,856 are hereby incorporated by reference for all purposes.

TECHNICAL FIELD

This disclosure relates generally to protection devices for powered components and systems and also to monitoring in relation to such protection devices.

BACKGROUND

A power supply can be connected to deliver power to one or more loads, for instance, in the form of various electronic devices and circuits. There is an inherent risk that a fault in any such device or circuit can result in system failure, for instance, when significantly higher current is pulled from the power supply than is safe for the load. System components can overheat, even resulting in electrical fires. A circuit breaker, fuse, or load switch can be connected between a power supply and a device to be powered to provide overload protection, including protection from over-current conditions as described above. For example, a load switch can be switched off to disconnect the power supply from the device. This can protect both the device and the power supply from fault conditions, such as short circuits, that might otherwise result in damage or failure of devices and circuits to be powered as well as the power supply.

Also, standards for the manufacture of modern electronic devices and systems often include power limiting and/or current limiting specifications. For instance, some specifications state that certain components cannot be allowed to supply more than 240 volt-amperes (VA). Thus, electronic device manufacturers are often asked to design circuits so that loads connected to a power supply are prevented from pulling more than the applicable power limiting or current limiting standard. Deficiencies exist with conventional approaches to designing and manufacturing protection devices such as load switches for systems in which the supplied current or power may exceed standards.

SUMMARY

The devices, apparatus, circuits, components, mechanisms, units, systems, and processes of this disclosure each have several innovative aspects, no single one of which is solely responsible for the desirable attributes disclosed herein.

According to one aspect, a system includes: a power supply, a device, and a switching mechanism coupled between the power supply and the device. The switching mechanism is configured to have an on state in which the power supply is coupled to the device or an off state in which the power supply is de-coupled from the device. The on state allows current to pass from the power supply to the device along a current path. A monitoring mechanism has one or more sensing inputs and a reporting output. The one or more sensing inputs can be coupled to sense an electrical characteristic at the current path. The electrical characteristic can be a current, voltage, and/or power by way of example. The monitoring mechanism is configured to provide a reporting signal at the reporting output responsive to the sensed electrical characteristic. The reporting signal is indicative of the sensed electrical characteristic. The monitoring mechanism can be integrated with the switching mechanism on a chip.

According to another aspect, a device includes a switching mechanism and a monitoring mechanism. The switching mechanism is configured to have an on state or an off state, where the on state allows current to pass along a current path. The monitoring mechanism is as described above. In some implementations, the monitoring mechanism is coupled to provide the reporting signal to a controller operatively coupled to cause the switching mechanism to have the on state or the off state. For example, the controller can be operatively coupled to cause the switching mechanism to have the off state responsive to the sensed electrical characteristic meeting or exceeding a designated threshold.

According to another aspect, a process includes: sensing, at the monitoring mechanism, an electrical characteristic at a current path; determining whether to cause the switching mechanism to have the off state responsive to the sensed electrical characteristic; and providing, at the monitoring mechanism, a reporting signal responsive to the sensed electrical characteristic. In some implementations, the determination of whether to cause the switching mechanism to have the off state can be based, at least in part, on a temperature. The temperature can be sensed at a location proximate the switching mechanism or the device, by way of example.

According to another aspect, a process includes: sensing, at the monitoring mechanism, an electrical characteristic at a current path; setting an adjustable reference electrical characteristic in response to the sensed electrical characteristic to provide a designated power level; comparing the sensed electrical characteristic with the adjustable reference electrical characteristic; and causing the switching mechanism to have the off state responsive to the sensed electrical characteristic meeting or exceeding the reference electrical characteristic.

According to another aspect, a device includes a switching mechanism and a controller. The controller includes a power measuring mechanism having: one or more current sensing inputs coupled to sense a current at the current path, and a voltage sensing input coupled to sense a voltage at a node between the switching mechanism and a device to be powered. The power measuring mechanism is configured to measure a power based on the sensed current and the sensed voltage. The controller is operatively coupled to cause the switching mechanism to have the off state responsive to one or more events indicative of a system fault condition. The one or more events include the measured power exceeding a designated power threshold. The controller is integrated with the switching mechanism on a chip such as a flip chip.

According to another aspect, a process includes: sensing a first electrical characteristic at a current path; sensing a second electrical characteristic at the current path after a time period; determining whether to cause the switching mechanism to have the off state responsive to the sensed first and second electrical characteristics meeting or exceeding a threshold; and providing a reporting signal responsive to the sensed first and second electrical characteristics, where the reporting signal is indicative of the sensed first and second electrical characteristics. The time period can be selectable or programmable, by way of example.

According to another aspect, a process includes: sensing a first electrical characteristic at a current path; comparing the sensed first electrical characteristic with a first threshold and a second threshold; when the sensed first electrical characteristic meets or exceeds the first threshold but does not meet or exceed the second threshold, sensing a second electrical characteristic at the current path; when the sensed second electrical characteristic meets or exceeds both the first threshold and the second threshold, causing the switching mechanism to have the off state; and when the sensed second electrical characteristic does not exceed the second threshold, generating a signal indicative of the sensed first electrical characteristic. The first and second thresholds can be adjustable.

Details of embodiments and implementations are set forth in the accompanying drawings and the description below. Various features of the disclosed subject matter may be realized by reference to the remaining portions of the specification and the drawings. Note that the relative dimensions of the following figures may not be drawn to scale.

BRIEF DESCRIPTION OF THE DRAWINGS

The included drawings are for illustrative purposes and serve only to provide examples of possible structures and process steps for the disclosed inventive devices, apparatus, circuits, components, mechanisms, units, systems, and processes.

Like reference numbers and designations in the various drawings indicate like elements.

DETAILED DESCRIPTION OF SPECIFIC EMBODIMENTS

Figure 1A:
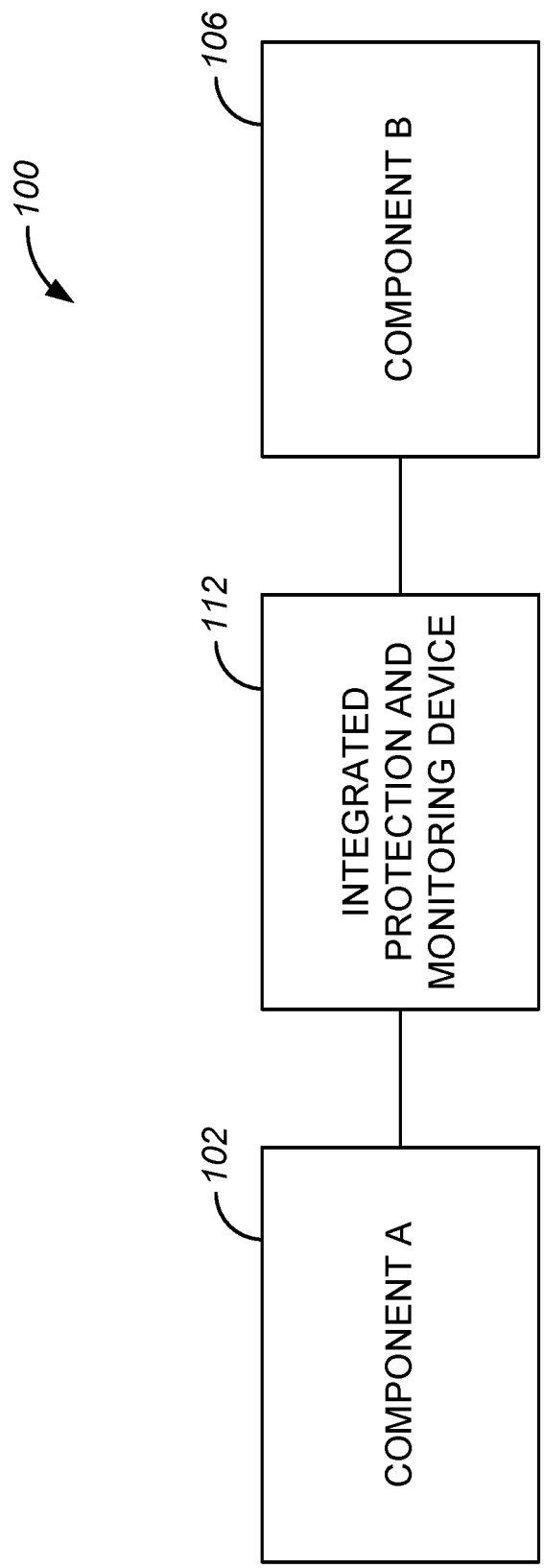
FIG. 1A is a simplified diagram of components of a system 100 incorporating an integrated protection and monitoring device, according to one or more embodiments of the invention.

Reference will now be made in detail to specific embodiments including the best modes contemplated by the inventors. Examples of these specific embodiments are illustrated in the accompanying drawings. While the disclosed subject matter is described in conjunction with these specific embodiments, it will be understood that it is not intended to be limited to the described embodiments. On the contrary, it is intended to cover alternatives, modifications, and equivalents as may be included within the spirit and scope of the invention as defined by the appended claims. In the following description, specific details are set forth in order to provide a thorough understanding of the disclosed subject matter. The disclosed subject matter may be practiced without some or all of these specific details. In addition, well-known features may not have been described in detail to avoid unnecessarily obscuring the disclosed subject matter.

Disclosed are embodiments of systems, apparatus, devices, circuits, components, mechanisms, units, and processes for integrated protection and monitoring of powered systems using a device, for example, in the form of an integrated circuit (IC).

In some embodiments, current monitoring services, voltage monitoring services, and/or power monitoring services can be provided in combination with a switching mechanism such as a load switch in a single chip or package to provide enhanced protection and monitoring of powered systems. In some embodiments, current reporting services, voltage reporting services, and/or power reporting services are also incorporated with the monitoring circuitry and the switching mechanism in a single IC, or a single package incorporating more than one IC, to provide the various services. In some embodiments, additional hardware providing temperature sensing and reporting services can also be incorporated in such an IC or package.

In some embodiments, described in greater detail below, one or more monitoring mechanisms to provide current, voltage, and/or power monitoring can be integrated with the switching mechanism in the same chip, while a separate controller and any accompanying hardware for controlling the switching on or off of the switching mechanism is located off of the chip, for instance, on a different chip in the same package. In some other embodiments, the monitoring mechanism(s) is an integral part of the controller, which is integrated with the switching mechanism in the same chip. In this way, a single chip can provide enhanced protection, monitoring, and control of a powered system based on events indicating that a system fault condition, also referred to herein as an overload condition, may have occurred. Such enhanced protection, monitoring, and control services, for instance, in a single IC, can be implemented with or without current reporting services, voltage reporting services, temperature reporting services, and/or power reporting services, as described herein.

In some embodiments, a controller with an integrated current, voltage, and/or power monitoring mechanism can be implemented to control switching on and off of a switching mechanism responsive to various events while also sensing and reporting electrical characteristics of the switching mechanism. The monitoring mechanism can be configured to provide this monitoring and reporting of current, voltage, and/or power, while the controller simultaneously controls the switching of the switching mechanism when certain conditions occur, such as over-current, over-voltage, and/or over-power events. Simultaneous temperature sensing and reporting can also be provided, such that high temperature events can cause the controller to switch off the switching mechanism. For instance, a temperature sensor can be integrated with a switching mechanism and a current monitoring mechanism in the same chip. In some embodiments, over-current events can be detected using electrical characteristics such as the actual current sensed in the path of the switching mechanism, a scaled value of the sensed current, or a voltage representation of such currents. For instance, a resistor can be coupled in the current path of the switching mechanism, and the voltage across the resistor can be measured by a voltage monitoring mechanism and compared with a threshold. Over-power events can be detected by a power monitoring mechanism based on the actual current sensed in the path of the switching mechanism and the actual voltage sensed at the input of the device to be powered.

In one embodiment of an integrated protection and monitoring device, a monitoring mechanism is provided in combination with a switching mechanism, where the combination has one or more outputs. Generally there is a power output, at which the switching mechanism provides current from one or more components to one or more further components. Such further components can be in the form of other powered electrical devices and/or power supplies, by way of example. Some embodiments only have this power output, while some other embodiments also include one or more reporting outputs from the integrated protection and monitoring device. Such an output can provide a reporting signal indicating an electrical characteristic of the protection and monitoring device or a system incorporating the protection and monitoring device. This characteristic could be the current going through the protection and monitoring device, the voltage at the input or the output of the protection and monitoring device, or the power being supplied at the power output of the protection and monitoring device. Thus, a controller and monitoring mechanism integrated with a switching mechanism can cooperate to provide power flow from a power supply to a device or system to be powered and control of the switching mechanism by the controller to stop power flow, such as switching off the switching mechanism if the monitoring mechanism indicates that: the current passing through the protection and monitoring device is too high, the monitored voltage at the input or the output of the protection and monitoring device is too high, and/or the power provided by such device is too high. In some other embodiments, the monitoring mechanism provides a reporting service indicating how much current is running through the protection and monitoring device, the voltage at the input or the output of the protection and monitoring device, and/or the power being supplied by the protection and monitoring device at any given time. The reporting signal can be in the form of an analog current, an analog voltage, or a digital output, depending on the desired implementation.

Thus, in some embodiments, simultaneous with the monitoring mechanism and the switching mechanism cooperating to protect the system from a variety of fault conditions, the monitoring mechanism senses and reports electrical characteristics such as the current and/or power provided by the switching mechanism. The monitoring and reporting of such electrical characteristics can be provided independent of control of the switching mechanism by a separate controller, in some embodiments. The information provided in the reporting signal can be further processed to optimize a system in which the controller and switching mechanism are included.

A reporting signal indicating a measured power, current, temperature, or voltage as described above can be delivered to various components such as a microcontroller or a comparator. For example, a comparator can be connected to compare a current reporting signal with a reference signal. For example, the reference signal can provide a reference current, and can be generated on-chip or off-chip. In this way, for example, if the sensed current exceeds a certain threshold, but is not so high as to cause the controller to switch off the switching mechanism, e.g., in the event of an over-current condition, the comparator output can go high, causing certain components being powered to turn off and reduce the generation of heat in the system. Thus, in the current monitoring example, the current reporting signal can essentially provide a warning level of current passing through the switching mechanism. A comparator or microcontroller providing such operations can be located on-chip or off-chip, depending on the desired implementation.

In some embodiments, a reference current with which a current reporting signal is compared can be adjusted in near real-time as the sensed voltage at an input or an output of the integrated protection and monitoring device, so a power limiting threshold is maintained as close as possible to a desired value, such as 240 VA. For instance, as described and illustrated herein with reference to FIG. 3B, a voltage can be sensed in the current path of a switching mechanism. The reference current can be altered in response to the sensed voltage value to maintain a power threshold at 240 VA.

In some embodiments, an output can include one or more digital signals, which indicates when some or all of the electrical characteristics of the device are within acceptable levels. This could be used to indicate when the voltage at the output of the integrated protection and monitoring device is at a valid state, and whether there are one or more faults. Examples of faults include over-temperature, over-current, over-voltage, and over-power events.

Also disclosed are embodiments of systems, apparatus, devices, circuits, components, mechanisms, units, and processes for integrated protection and control based on one or more events indicative of a system fault condition, independent of whether current monitoring and reporting services are also provided. A controller can be integrated on-chip with the switching mechanism to control switching on and off of the switching mechanism responsive to one or more of various events including over-power, over-current and/or over-temperature events, as well as a combination of such events in some embodiments.

In some embodiments, over-power events can be detected using a power measurement based on the voltage sensed at an output of the switching mechanism and the actual current passing through the switching mechanism. In an alternative embodiment, the power measurement can be based on a scaled value of the sensed current, for instance, using the power sensor of FIG. 6E described in greater detail below.

Using the disclosed embodiments, circuits and devices to be powered can pull close to power limiting specifications such as 240 VA or other parameters such as current limiting specifications without exceeding such parameters. Some of the disclosed embodiments provided enhanced accuracy and responsiveness in control of a switching mechanism and, thus, generally allow for the transfer of more power from one component to another. Such embodiments are also cost-effective and occupy minimal chip real estate. These attributes add value to the overall system.

FIG. 1A is a simplified diagram of components of a system 100 incorporating an integrated protection and monitoring device, according to one or more embodiments of the invention. An integrated protection and monitoring device 112 is coupled between a first component 102 ("Component A") and a second component 106 ("Component B"). For example, Component A can be a power supply, while Component B can be a device or system to be powered, also referred to herein as a load. In some implementations, Component B of FIG. 1A is a simplified representation of a number of electrical devices or systems to be powered by Component A. That is, in some implementations, a number of components can be located "downstream" in a power supply chain from Component A, with integrated protection and monitoring device 112 serving as an intermediary to provide protection to these components. In other implementations, both Components A and B are power supplies, as described in greater detail below. Depending on the desired implementation, the integrated protection and monitoring device 112 can include one or more of: a current monitoring mechanism, a current reporting service via a current reporting signal, a voltage monitoring mechanism, a voltage reporting service via a voltage reporting signal, a power measuring mechanism, a power reporting service, a temperature monitoring mechanism, e.g., using a temperature sensor, a temperature reporting service via a temperature reporting signal, and other mechanisms, circuits, units, and services as described herein. These various mechanisms and services can all be integrated in the same device, for instance, in the form of a monolithic IC or a multi-chip package.

Figure 1B:
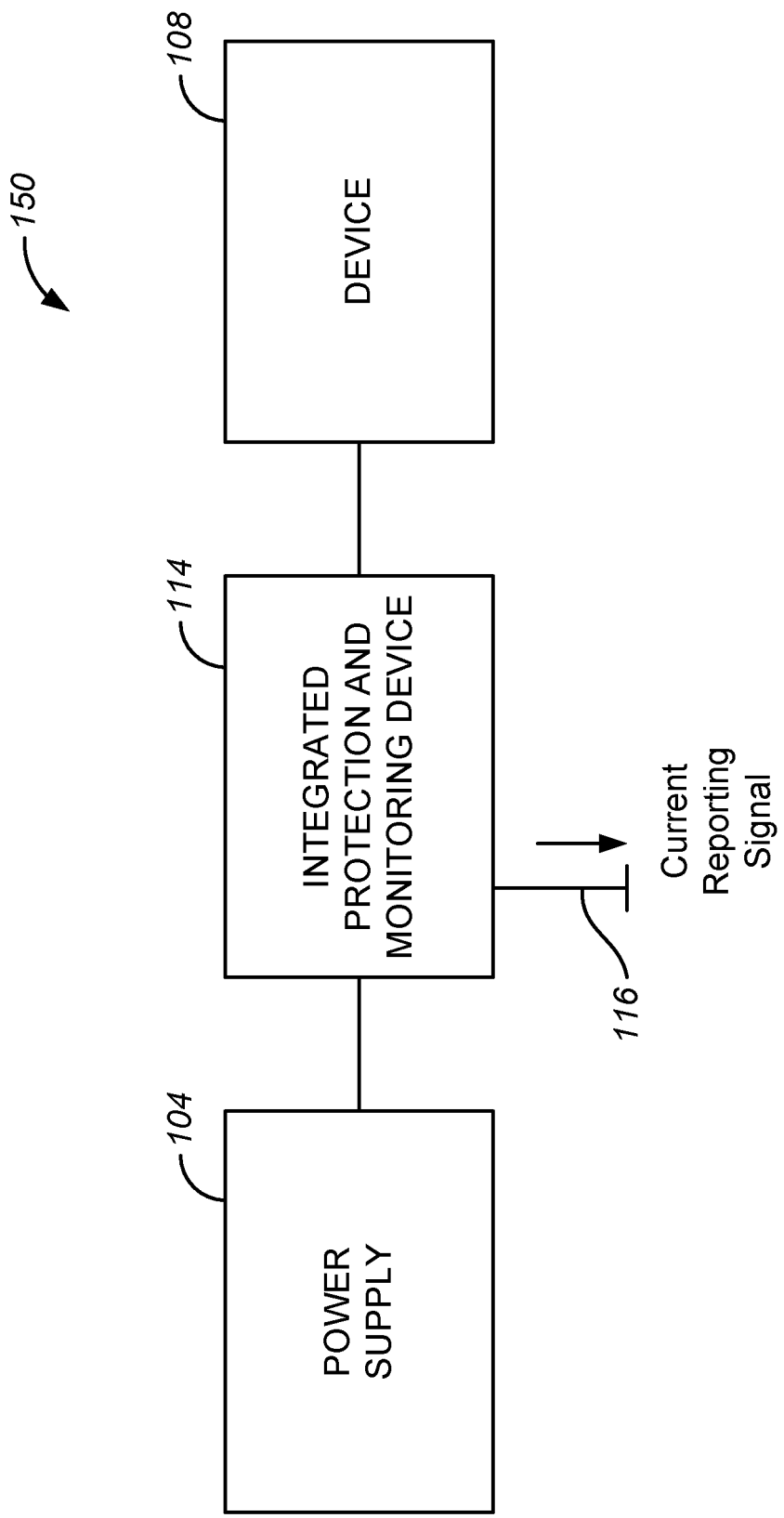
FIG. 1B is a simplified diagram of components of a system 150 incorporating an integrated protection and monitoring device with current monitoring and reporting, according to one or more embodiments of the invention.

FIG. 1B is a simplified diagram of components of a system 150 incorporating an integrated protection and monitoring device with current monitoring and reporting, according to one or more embodiments of the invention. In this particular example, the integrated protection and monitoring device 114 is coupled between two components, a power supply 104 and a device 108 to be powered. The power supply 104 can be any of a variety of power sources. For instance, one or more lithium-ion batteries can serve as power supply 104 in some implementations, while wall-supplied systems can be used in other implementations. The power supply 104 can provide a variety of voltages, such as 5-volt or 12-volt direct current (DC). Other higher or lower voltage power sources can be used as power supply 104 depending on the desired implementation. The device 108 can include one or more components and can be in the form of a system of sub-devices and components. Examples of such a device 108 include notebook computers, notepads, smartphones, and other such personal computing devices. In other implementations, device 108 is a high reliability system such as a network router having multiple processing cards configured to provide routing functions and appropriate backup. Similar such devices include distributed computing boards and various parallel processing devices.

In FIG. 1B, the integrated device 114 is coupled between the power supply 104 and the device 108. In one implementation of device 114, a switching mechanism can be integrated with a monitoring mechanism, as described in greater detail below, on the same chip. In other implementations, such a switching mechanism and monitoring mechanism can be separate components and located on different chips in the same package. Various configurations of the switching mechanism and monitoring mechanism in integrated device 114 are described below. In this implementation, the integrated device 114 has an output port 116 at which a current reporting signal can be provided. The output port 116 can be implemented as a pin on the chip and/or connected to other on-chip and off-chip circuitry. In one example, device 114 can be coupled to sense a current passing between power supply 104 and device 108. The device 114 can be configured to output the current reporting signal responsive to this sensed current. The current reporting signal can be indicative of the current supplied from power supply 104 to device 108.

Figure 2:
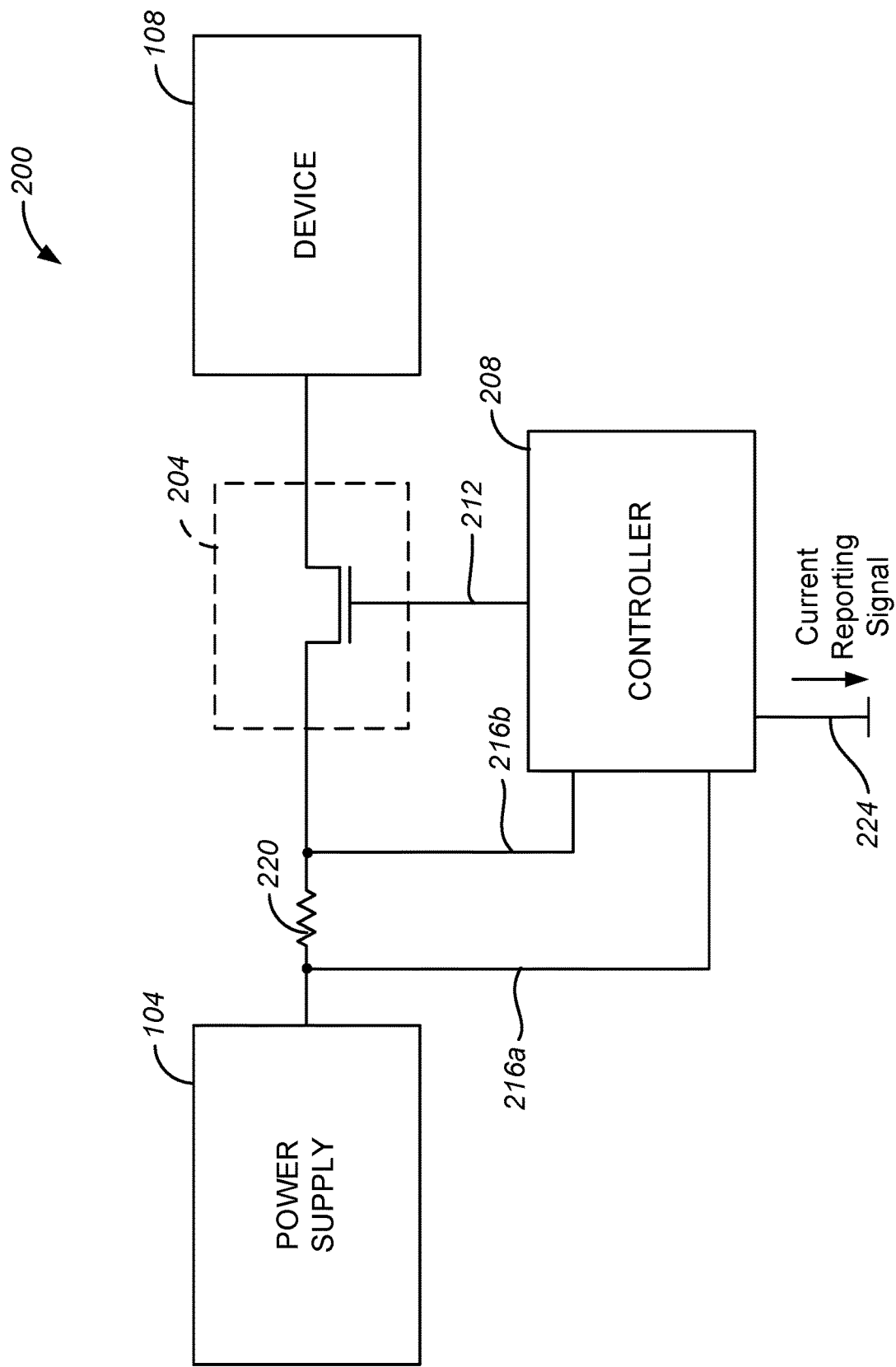
FIG. 2 is a simplified diagram of components of a system 200 incorporating a protection and monitoring device with current monitoring and reporting using a sense resistor, according to one or more embodiments of the invention.

FIG. 2 is a simplified diagram of components of a system 200 incorporating a protection and monitoring device with current monitoring and reporting using a sense resistor, according to one or more embodiments of the invention. In FIG. 2, a separate switching mechanism 204 is illustrated. The switching mechanism 204 is coupled between power supply 104 and device 108. In this example, the switching mechanism 204 is represented as a transistor, such as a field effect transistor (FET). Switching mechanism 204 can be structured to have one or more such FETs, including but not limited to LDMOS, standard MOS, or GaAs, that can be configured as N-channel or P-channel depending on the desired implementation. Other various types of transistors can be used to implement switching mechanism 204 including bipolar junction transistors (BJT). The switching mechanism 204 and any of the various switching mechanisms described herein can be implemented as a single transistor or a combination of two or more transistors, in different embodiments.

The switching mechanism 204 can have a variety of implementations, depending on the desired application. For instance, switching mechanism 204 can be a load switch including a pass FET. In other applications, the switching mechanism 204 can be implemented as a switch such as an OR'ing switch, a circuit breaker, a fuse, or a hot swap switch. In some of these implementations, the switching mechanism can include one or more transistors as shown in the various FIGs. While switching mechanism 204 is often illustrated in the FIGs. in the form of a single transistor, those skilled in the art should appreciate that other embodiments are contemplated in which switching mechanism includes more than one transistor or switching components other than a transistor, and the claims are intended to cover such alternative embodiments.

The current that can pass from power supply 104 to device 108 through switching mechanism 204 can be of any suitable range, depending on the desired implementation. For example, in some implementations, switching mechanism 204 operates in the range of milliamps, while in other implementations, switching mechanism 204 can handle current in the range of 100 amps or more.

In FIG. 2, switching mechanism 204 is generally configured to have an on state in which power supply 104 is coupled to device 108 or an off state in which power supply 104 is de-coupled from device 108. That is, switching mechanism 204 is configured to switch between the on state and the off state. The on state allows current to pass from power supply 104 to device 108 along a current path, while the off state prevents this passage of current. In the example of FIG. 2, such a current path is defined by the coupling of power supply 104 to device 108 through switching mechanism 204. The switching mechanism can be switched off when one or a combination of events is established, as described in examples below. Often, one or more of such events indicate that power supply 104 should be disconnected from device 108 to protect system 200 from various system fault conditions.

In FIG. 2, a controller 208 is operatively coupled to control the switching of switching mechanism 204 between the on state and the off state. In this example, controller 208 has a control output 212 coupled to the gate of the FET of switching mechanism 204. While not shown, in some implementations of FIG. 2, a driver is coupled between controller 212 and the FET gate. The same is true for the FIGs. described below in which a driver is not explicitly shown between the controller and the switching mechanism. Such a driver can be optimized for turn-on delay and speed as well as turn-off delay and speed. The controller can be operatively coupled to cause the switching mechanism to switch off responsive to one or more various events disclosed herein. For example, when a power monitoring mechanism separate from or integral with controller 208 indicates that a power delivered from switching mechanism 204 to device 108 meets or exceeds a designated power threshold, such as 240 VA, or a current monitoring mechanism separate from or integral with controller 208 indicates that a current sensed along the current path between power supply 104 and device 108 exceeds a designated current threshold, the controller 208 can be configured to cause switching mechanism 204 to switch off and output a signal reporting the overload condition. Such a designated threshold can be indicative of a system fault condition of any of a variety of system contexts in which controller 208 is implemented, such as system 200 of FIG. 2. For instance, a threshold of several amps can be set for a device 108 in the form of a cell phone, while a threshold in the range of hundreds of amps can be defined or set for a computing device such as a server. In another example, the designated threshold is in the range of milliamps. This and other thresholds as disclosed herein can be set internally or externally, depending on the desired implementation.

In FIG. 2, the system fault condition can be any of a variety of faults, such as a short circuit or one or more parts of device 108 becoming fatigued or failing. In one example, it is known that the system 200 generally pulls 10 amps of current between power supply 104 and device 108. In such an example, the threshold at which controller 208 is configured to switch off switching mechanism 204 can be set at about 15 amps, indicating that a short circuit or part failure has likely occurred. Thus, in such an implementation, the current provided between power supply 104 and device 108 could fluctuate up to about 14 amps without causing controller 208 to switch off switching mechanism 204.

In another example, when device 108 is implemented as a system including multiple components, the threshold at which controller 208 is set to switch off switching mechanism 204 can be defined at an appropriate level to prevent the multiple components within the system from overheating and causing the overall system 200 to fail. Setting the threshold at the appropriate level can also be desirable to simply prevent the device 108 from dragging down power supply 104 in situations where, for example, power supply 104 is used to power other components or devices in a larger network.

In FIG. 2, the controller 208 incorporates a current monitoring mechanism configured with two current sensing inputs connected along the current path. In this example, these current sensing inputs 216a and 216b are coupled on opposite sides of a sense resistor 220 coupled between power supply 104 and switching mechanism 204. Sense resistor 220 can be an external sense resistor or it can be internal, e.g., integrated as a component of device 112 of FIG. 1A or device 114 of FIG. 1B, in which switching mechanism 204 and controller 208 can also be integrated. The sense resistor 220 can have a suitable resistance to provide a voltage responsive to the current being delivered from power supply 104 to device 108 through switching mechanism 204. Thus, in this example, the current sensing inputs 216a and 216b are coupled to sense a voltage across resistor 220 representative of the current passing from power supply 104 to device 108 along the current path when switching mechanism 204 is switched on.

In FIG. 2, the controller 208 also has a current reporting output port 224. In some embodiments, a current monitoring mechanism incorporated in the controller 208 is configured to sense the current along the current path by virtue of the current sensing inputs 216a and 216b. The current monitoring mechanism of controller 208 is configured to generate a current reporting signal responsive to the current sensed at the current sensing inputs 216a and 216b. This reporting signal is provided at the current reporting output port 224. The current reporting signal is generally indicative of the sensed current being provided from power supply 104 to device 108. The current monitoring mechanism of controller 208 is configured to sense the current along the current path between power supply 104 and device 108 and output the current reporting signal, as described above, while the controller provides other capabilities including over-current protection to switch off switching mechanism 204 when such an over-current event is identified. One or more monitoring mechanisms can be incorporated in controller 208 and can be configured to concurrently provide other services, including power sensing and temperature sensing, as described in greater detail below.

The various current reporting signals, temperature reporting signals, and power reporting signals provided in the implementations disclosed herein can be in an appropriate form to be sensed and processed by additional components integral with the various systems illustrated in the FIGs. as well as components external to the illustrated systems in the FIGs. For example, the current reporting signal can indicate a current value or a range of current values over some time. In another example, the current reporting signal can be a voltage signal including a voltage value or range of voltages measured over some time. The voltage signal can be referenced to ground or another convenient voltage. For instance, in FIG. 2, current reporting output port 224 can be coupled to an input terminal of an on-chip or off-chip resistor. When circuitry in controller 208 provides a current signal to output port 224, a voltage can be measured across the resistor and compared with a threshold. The resistance value of the resistor and the voltage at the output terminal of the external resistor can be set to provide the desired accuracy and voltage range. In another example, the current reporting signal is provided in the form of a digital signal to be processed by digital hardware and software components internally or externally located with respect to the particular units and systems of FIG. 2.

Figure 3A:
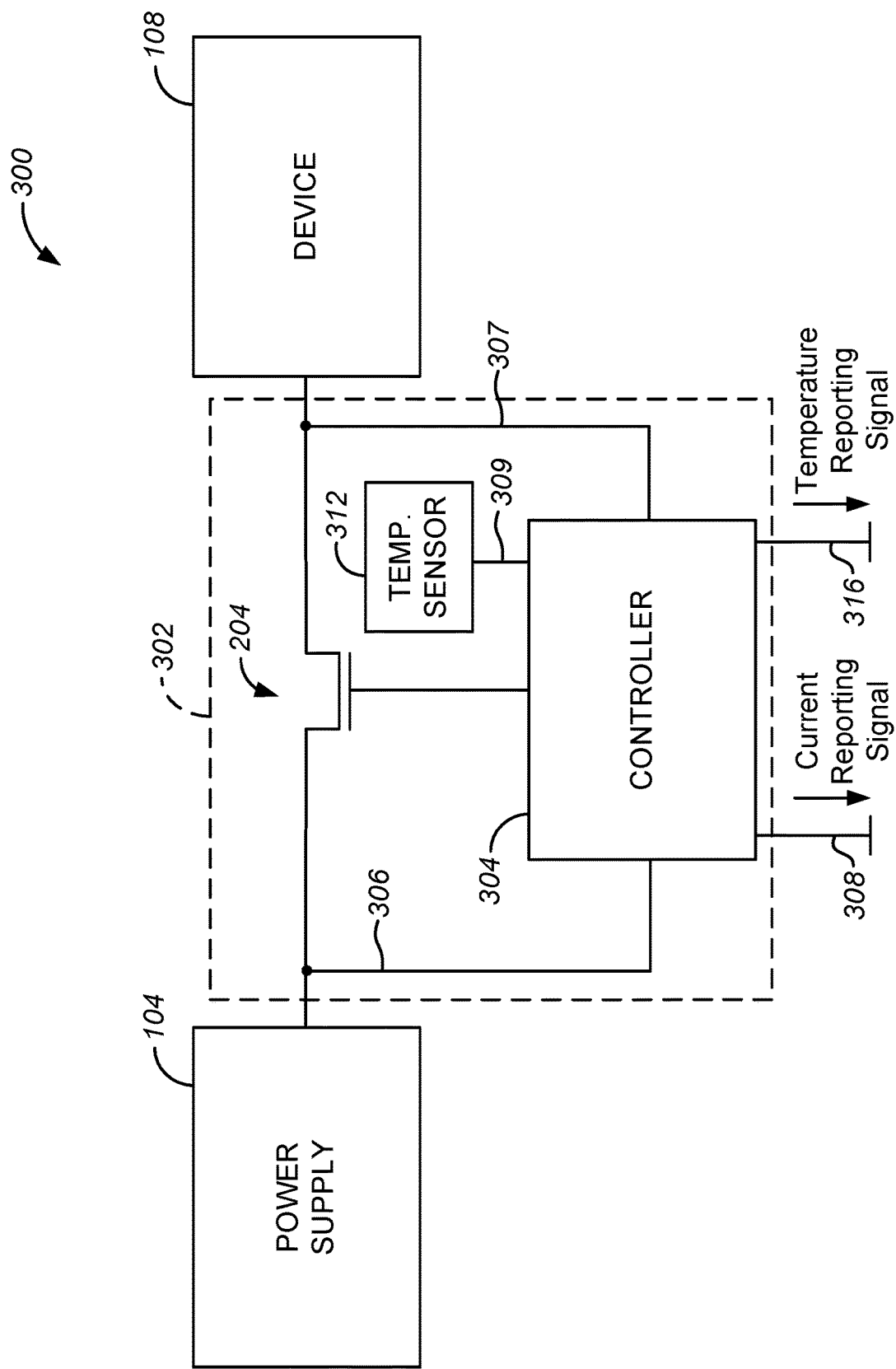
FIG. 3A is a simplified diagram of components of a system 300 incorporating an integrated protection and monitoring device with integrated current monitoring and temperature sensing, according to one or more embodiments of the invention.

FIG. 3A is a simplified diagram of components of a system 300 incorporating an integrated protection and monitoring device 302 with integrated current monitoring and temperature sensing, according to one or more embodiments of the invention. In FIG. 3A, a controller 304 can include an integral current monitoring mechanism configured and coupled to provide current sensing and reporting services in a different manner than controller 208 of FIG. 2. In this example, controller 304 has a first current sensing input 306 coupled at a node between power supply 104 and switching mechanism 204, and a second current sensing input 307 coupled at a node between switching mechanism 204 and device 108, as shown in FIG. 3A. Using current sensing inputs 306 and 307, the current monitoring mechanism of controller 304 is configured to sense the current being provided from power supply 104 to device 108 without the use of a sense resistor, in contrast with FIG. 2. For instance, a first voltage can be sensed at the node between power supply 104 and switching mechanism 204, and a second voltage can be sensed at the node between switching mechanism 204 and device 108. Responsive to these sensed voltages, the integral current monitoring mechanism of controller 304 can output a suitable current reporting signal at a current reporting output port 308.

In FIG. 3A, the controller 304 is configured to provide additional services to control the switching of switching mechanism 204 in addition to the current sensing and reporting services of the integral current monitoring mechanism. For instance, in FIG. 3A, controller 304 has a temperature sensing input 309 coupled to temperature sensor 312, which is located proximate to one or more transistors of switching mechanism 204 in this example. In this way, temperature sensor 312 monitors and provides the monitored temperature of switching mechanism 204 to the temperature sensing input 309 of controller 304. In some other embodiments, temperature sensor 312 is located near device 108 and may or may not be located near switching mechanism 204. In this way, the switching on or off of the switching mechanism by controller 304 can be made responsive to the sensed temperature of device 108 rather than the temperature of the switching mechanism 204. The temperature sensor 312 can be located on-chip or off-chip with respect to the integrated protection and monitoring device 302, depending on the desired implementation. Controller 304 is operatively coupled to cause switching mechanism 204 to switch off responsive to the sensed temperature at sensor 312. For instance, when the monitored temperature at sensor 312 meets or exceeds a designated threshold corresponding to an over-temperature event, controller 304 can be configured to switch off switching mechanism 204. This temperature sensing service can be provided concurrently with over-current protection as described above and the generation and delivery of the current reporting signal at output port 308. The sensed temperature from temperature sensor 312 can also be reported in the form of a temperature reporting signal at an output port 316. In some instances, when the temperature reporting signal is a voltage signal, the reporting signal can be translated to a digital word or scaled to a more desirable voltage range and delivered to an output pin of the chip. The temperature reporting signal can be provided simultaneously with control operations of controller 304 based on the monitored temperature.

Figure 3B:
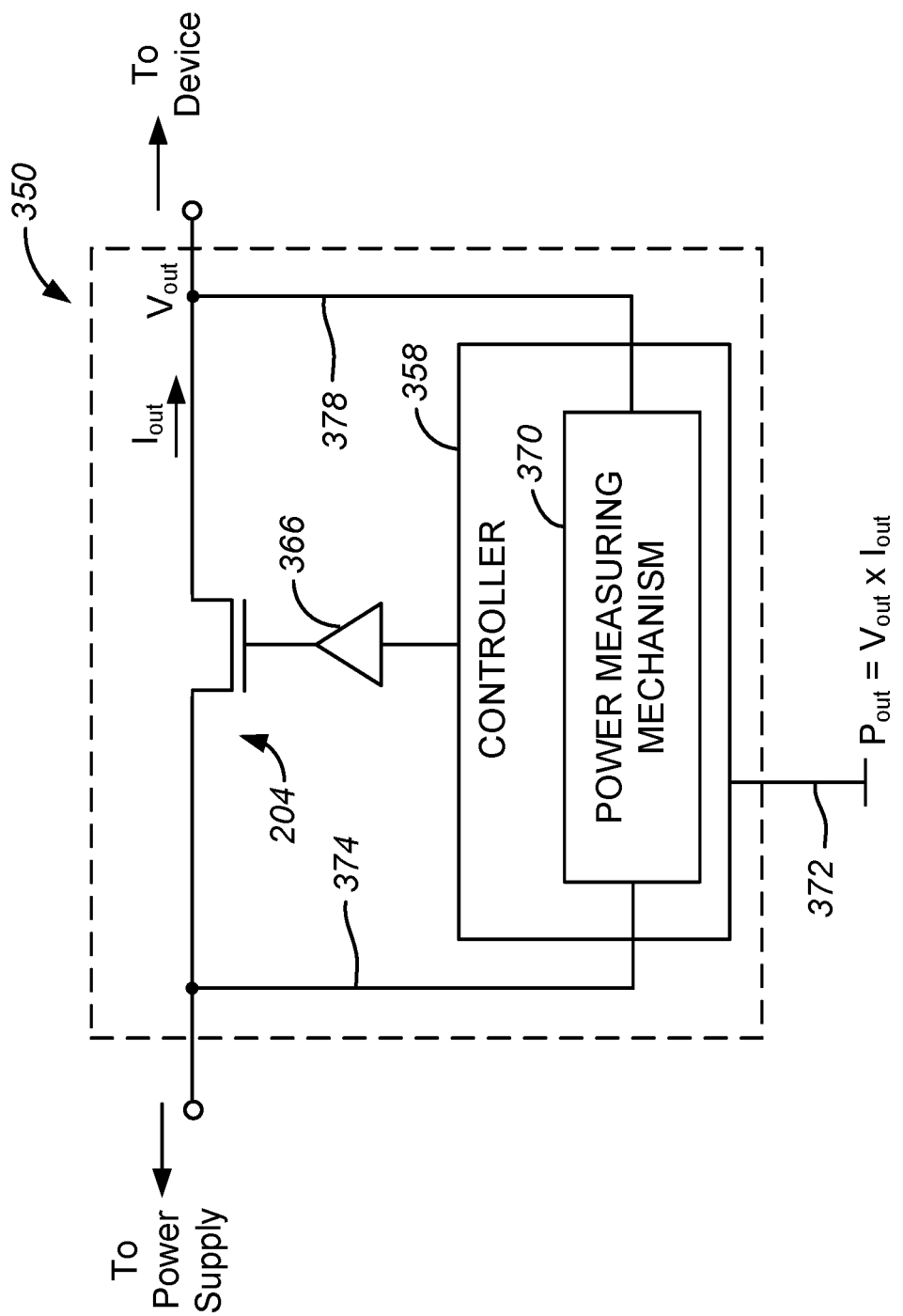
FIG. 3B is a simplified diagram of components of an integrated protection and monitoring device 350 for switching control based on power measurements, according to one or more embodiments of the invention.

FIG. 3B is a simplified diagram of components of an integrated protection and monitoring device 350 for monitoring and switching control based on power measurements, according to one or more embodiments of the invention. In FIG. 3B, a controller 358 has an output coupled to a driver 366, which controls the switching on/off of switching mechanism 204. Here, the controller 358, driver 366, and switching mechanism 204 are integrated in the same device 350, for instance, in the same chip.

In FIG. 3B, in this example, the controller 358 includes an integral power measuring mechanism 370 configured to provide power measurement services to determine whether an over-power event has occurred, indicating that too much power is being pulled through switching mechanism 204. The power measuring mechanism 370 has a current sensing input 374 connected at a node in the current path between a power supply and switching mechanism 204. The power measuring mechanism 370 has a voltage sensing input 378 coupled to sense a voltage, Vout, at a node between switching mechanism 204 and the device to be powered. The current, Iout, passing through switching mechanism 204, can be sensed using inputs 374 and 378. The power measuring mechanism 370 is configured to measure a power based on the sensed current and the sensed voltage. The power measuring mechanism 370 can calculate a power, Pout=Vout*Iout, and so that Pout can be compared with a designated power threshold to determine whether an over-power event has occurred, that is, when Pout meets or exceeds the designated threshold. Pout generally represents the power being provided from the switching mechanism 204 to the device (load). Pout can be indicated in a power reporting signal provided at an output port 372, which can be implemented as a pin on the chip and/or connected to other on-chip and off-chip circuitry.

In FIG. 3B, the driver 366 is operatively coupled to drive the gate of a FET of switching mechanism 204 responsive to a control output from controller 358 indicating whether switching mechanism 204 is to be switched on or off. Various implementations of driver 366 are possible. For instance, driver 366 can be structured as a single transistor, a series of two or more transistors, a current source, a capacitor, and combinations of such circuit elements. In this and some other embodiments, the switching mechanism 204 can be switched off by driving the gate to ground or to another voltage, such as the gate-source voltage of the FET of switching mechanism 204, depending on the desired implementation. Changing the voltage at the gate to such an adjusted voltage can limit the current passed through the transistor. In some implementations, the gate of switching mechanism 204 can be charged or discharged slowly to limit the turn-on or turn-off time of the switching mechanism 204. In some implementations, in which it is desirable to control the responsiveness of the switching mechanism 204 when switching on or off, a current source can be used as one implementation of driver 366 by having a known current charge or discharge the gate of the transistor of switching mechanism 204. In certain implementations, a capacitor can also be connected between the current source and the transistor to change the timing. The controller 358 can be configured to control switching on/off of the switching mechanism 204 when the power measured by power measuring mechanism 370 exceeds a designated threshold, indicative of an over-power event. Thus, the controller 358 is capable of switching off switching mechanism 204 when the calculated power meets or exceeds a threshold, such as 240 VA. The circuitry implementing power measuring mechanism 370 can be integrated with the switching mechanism 204, e.g., fabricated on the same die and located on the same chip as the switching mechanism.

In FIG. 3B, in some implementations, the controller 358 can switch on/off the switching mechanism 204 based only on the power measured by power measuring mechanism 370. In some other implementations, the controller 358 is configured to determine whether to switch off the switching mechanism based on the power measurement in combination with one or more other parameters as discussed herein, such as current sensing and/or temperature sensing measurements. Thus, a current monitoring mechanism and/or temperature monitoring mechanism can be incorporated with power monitoring mechanism 370 in controller 358, depending on the desired implementation. For instance, when power calculations by power measuring mechanism 370 are slower than desired, current sensing for over-current events can also be performed within controller 358, in which case the controller 358 can be configured to switch off switching mechanism 204 when the current exceeds a designated current threshold.

In some implementations, as described above, over-power events can be detected using a power measurement based on Vout and the actual current passing through the switching mechanism 204. In alternative implementations, the power measurement can be based on a scaled value of the sensed current, for instance, using a current reporting signal provided by a current mirror mechanism as described below with reference to FIG. 5.

Figure 3C:
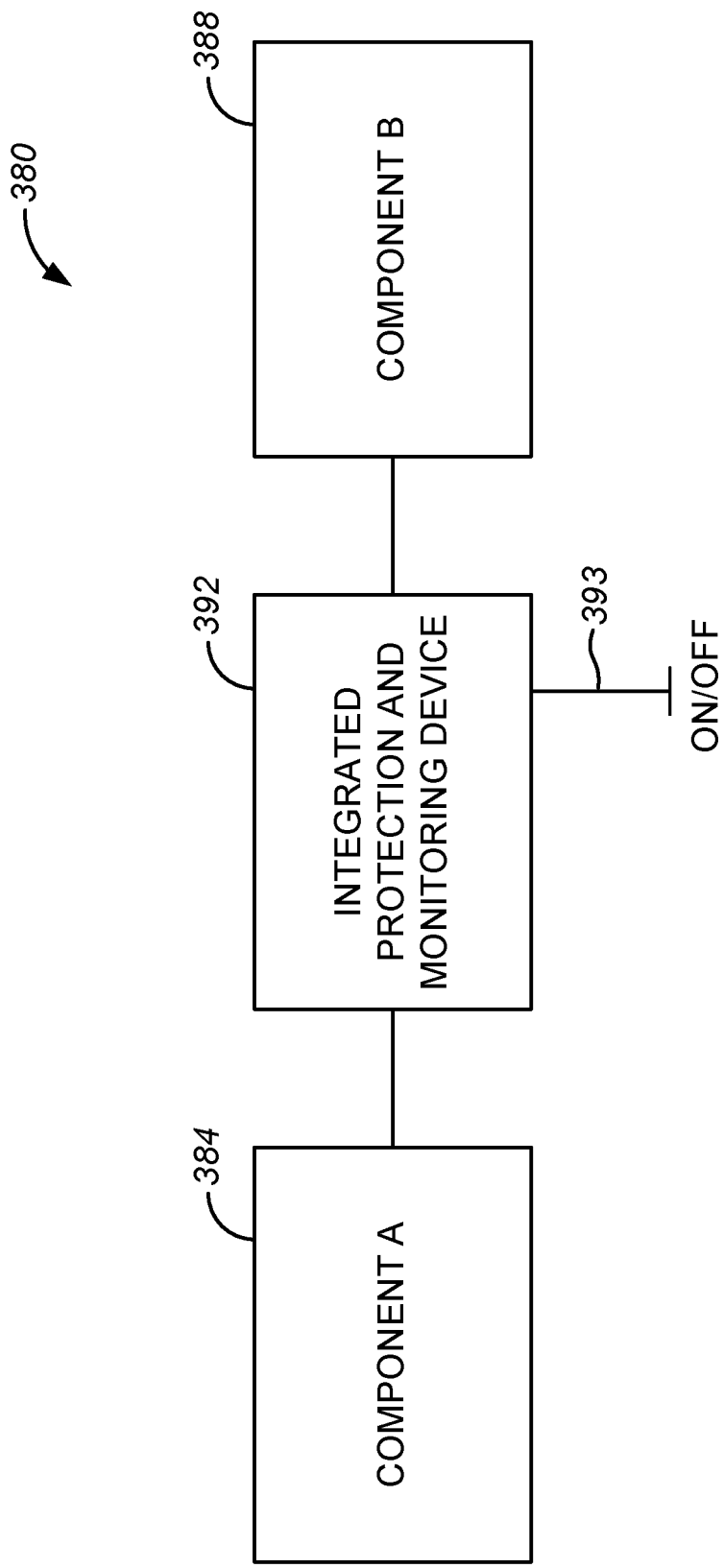
FIG. 3C is a simplified diagram of components of a system 380 incorporating an integrated protection and monitoring device, according to one or more embodiments of the invention.

FIG. 3C is a simplified diagram of components of a system 380 incorporating an integrated protection and monitoring device 392, according to one or more embodiments of the invention. In one example, the integrated device 392 can include a hot swap device, as described in greater detail below, connected between the components 384 and 388. Also, in this example, the integrated protection and monitoring device 392 has an input in the form of an on/off switch 393. The on/off switch is coupled to the switching mechanism, such as mechanism 204 of FIGS. 3A and 3B, to provide manual or otherwise off-chip control to switch the switching mechanism on or off independent of any monitoring as described herein. The on/off switch 393 can be implemented as a pin on the integrated chip including the switching mechanism.

Figure 3D:
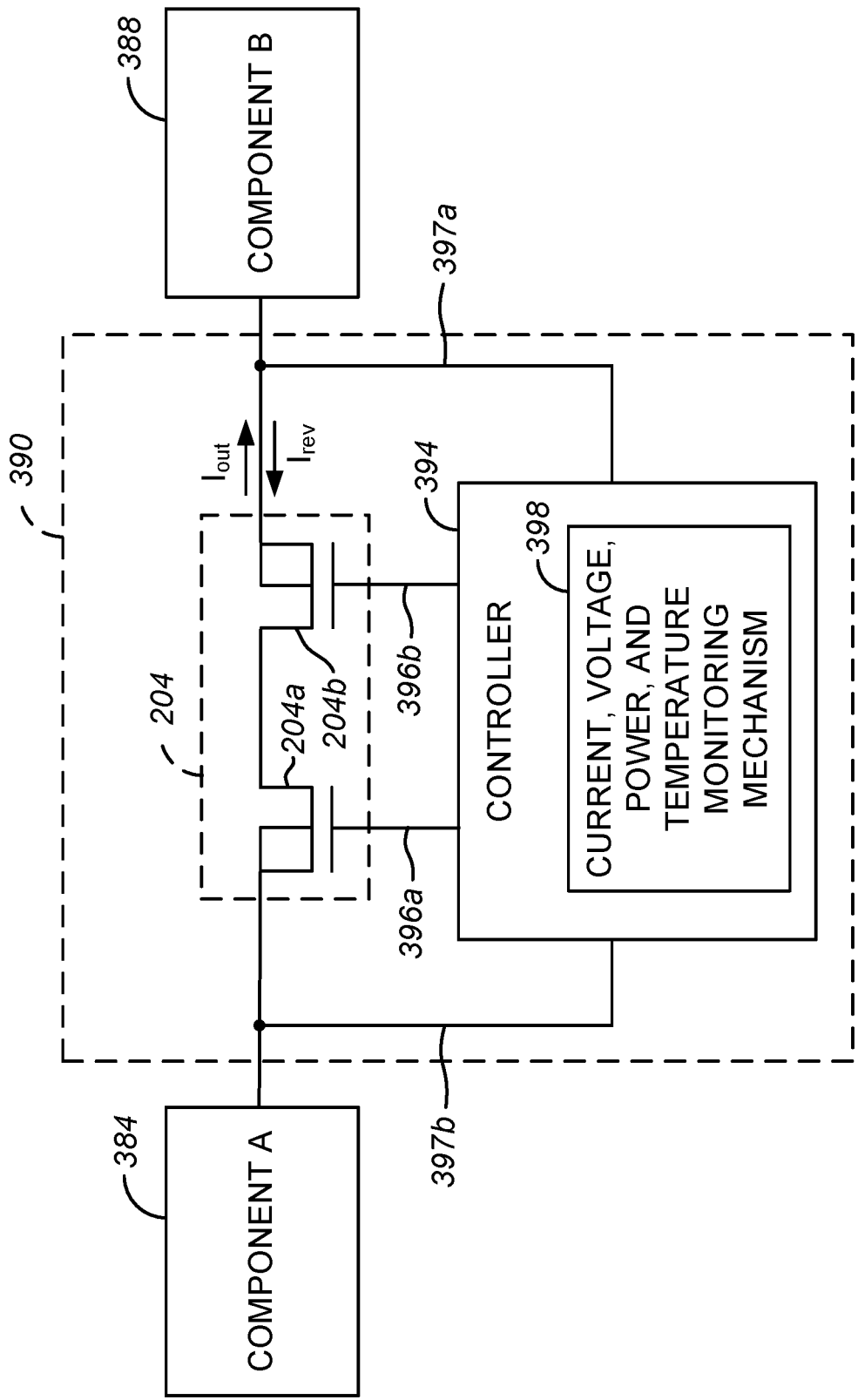
FIG. 3D is a simplified diagram of components of a system incorporating an integrated protection and monitoring device 390, according to one or more embodiments of the invention.

FIG. 3D is a simplified diagram of components of a system incorporating an integrated protection and monitoring device 390, according to one or more embodiments of the invention. In the implementation of FIG. 3D, the switching mechanism 204 is implemented to include a reverse current transistor 204a connected in series with a forward current transistor 204b, both coupled between components 384 and 388. For instance, transistors 204a and 204b can both be P-channel or N-channel MOSFETs. These back-to-back switches 204a and 204b cooperate to provide reverse current protection, that is, to prevent current "Irev" possibly flowing back from component 388 to component 384 when the transistors 204a and 204b are in the off state. The reverse current transistor 204a has a reverse bulk connection with respect to the bulk connection of forward current transistor 204b.

In FIG. 3D, a controller 394 has two outputs 396a and 396b coupled respectively to control the switching on/off of transistors 204a and 204b. Here, the controller 394 and switching mechanism 204 are integrated in the same device 390, for instance, on the same chip. In FIG. 3D, the controller outputs 396a and 396b are operatively coupled to drive the gates of transistors 204a and 204b responsive to measurements by a current, voltage, power, and temperature mechanism 398 indicating whether switching mechanism 204 is to be switched on or off. In this example, current monitoring services, voltage monitoring services, power monitoring services, and temperature monitoring services, often implemented in respective separate mechanisms, are incorporated into a single mechanism 398 integral with controller 394.

In FIG. 3D, the controller 394 has a first sensing input 397a coupled at a node between switching mechanism 204 and component 388 to sense a forward current, Iout, passing through switching mechanism 204, as well as a reverse current, Irev, possibly passing in the opposite direction of Iout. In this way, controller 394 is operatively coupled to switch off the load switch 204 responsive to either Iout exceeding a designated threshold or Irev exceeding a designated threshold. In some implementations, controller 394 is also operatively coupled to switch off the switching mechanism 204 if the monitored voltage at the first sensing input 397a or a second sensing input 397b coupled at a node between component 384 and switching mechanism 204 exceeds a threshold, if a monitored temperature exceeds a threshold, and/or the measured power exceeds a threshold, as further described herein with respect to various embodiments. For instance, the power measurement in the implementation of FIG. 3D can be based on Iout or Irev.

In some implementations, the mechanism 398 is only coupled to sense Iout so that controller 394 can switch off one of the transistors of switching mechanism 204 when Iout exceeds a designated forward current threshold. In some other implementations, mechanism 298 is only coupled to sense Irev and switch off one of the transistors of switching mechanism 204 when Irev exceeds a designated reverse current threshold.

Figure 3E:
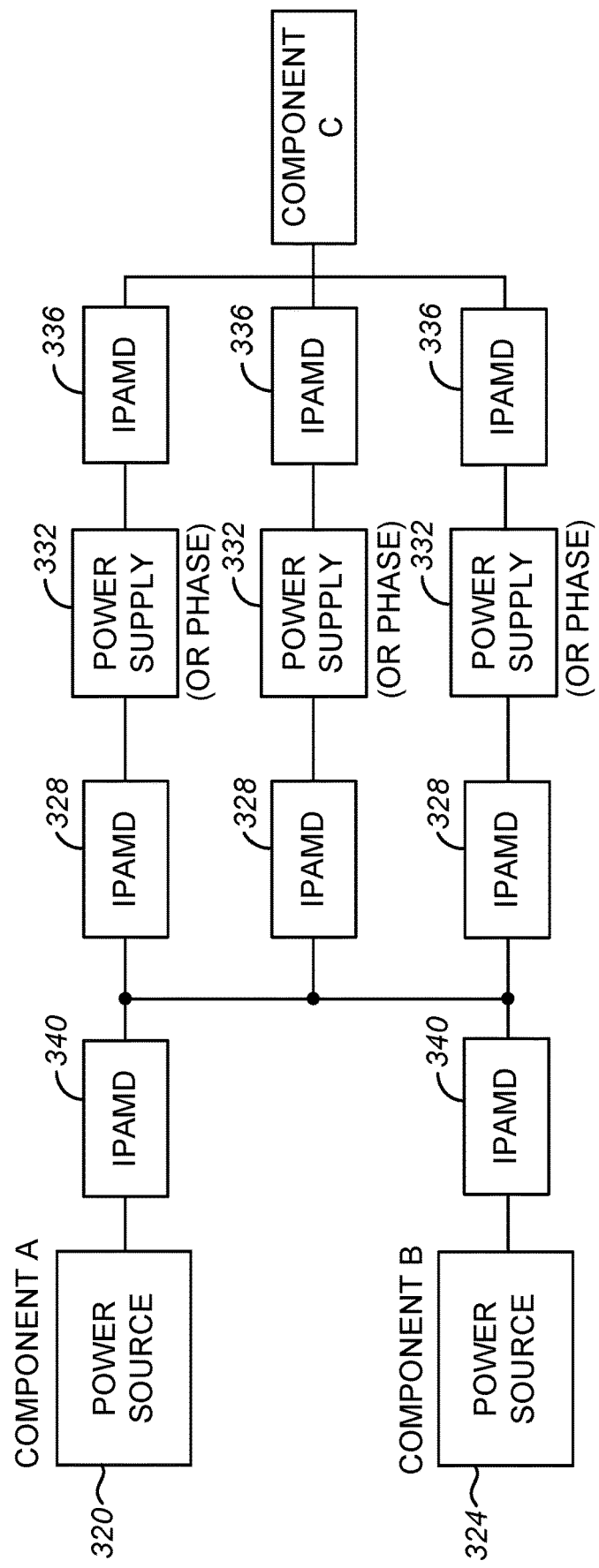
FIG. 3E is a simplified diagram of components of a redundant system with redundant common power sources, according to one or more embodiments of the invention.

FIG. 3E is a simplified diagram of components of a redundant system with redundant common power sources, according to one or more embodiments of the invention. In this implementation, integrated protection and monitoring devices (IPAMD) 328 protect a power domain including one or more power supplies 332. In this example, each power supply 332 has an input coupled to an output of a respective IPAMD 328, and each power supply 332 has an output coupled to an input of a respective IPAMD 336. The outputs of the IPAMDs 336 are coupled to a Component C, which can be a load in the form of a device or system to be powered.

In FIG. 3E, each IPAMD 328 can be implemented to protect a respective power supply 332 of the power domain according to the various embodiments disclosed herein. For instance, an IPAMD 328 can be implemented as a hot swap device or with 240 VA power protection as described above with reference to FIG. 3B. OR'ing protection can be implemented using an IPAMD 336 for individual power supplies or individual phases of a multiphase power supply. A fault in any one of the power supplies or phases of a single multiphase power supply 332 can be detected by its respective IPAMD 336, and that unit can be switched off to prevent the system from failing.

In the example of FIG. 3E, redundant components A and B, in the form of a power source 320 and a power source 324, each have an output coupled to a respective IPAMD 340. In this embodiment, IPAMDs 340 provide an OR'ing function. The outputs of the IPAMDs 340 are coupled to inputs of the IPAMDs 328. In one example, power sources 320 and 324 can be in the form of AC-to-DC sources, while power supplies 332 are post-regulators to deliver specific voltages for specific loads in the system.

In some embodiments, each of power supplies 332 is a complete power supply. In some other embodiments, each power supply 332 is a branch of a single power supply. For example, the power supplies 332 can each have a respective "OR" phase, referring to a specific phase of a multi-phase regulator.

In an alternative embodiment to that shown in FIG. 3E, rather than coupling the outputs of the IPAMDs 340 directly to all of the inputs of IPAMDs 328, the outputs of IPAMDs 340 are coupled to a shared input of an additional intermediary IPAMD (not shown in FIG. 3E), the output of which is coupled to all of the inputs of the IPAMDs 328. In this alternative embodiment, similar to FIG. 3E, there are redundant power sources 320 and 324 and redundant voltage regulator modules or phases in the form of power supplies 332, as well as the additional protection of the intermediary IPAMD.

Figure 4A:
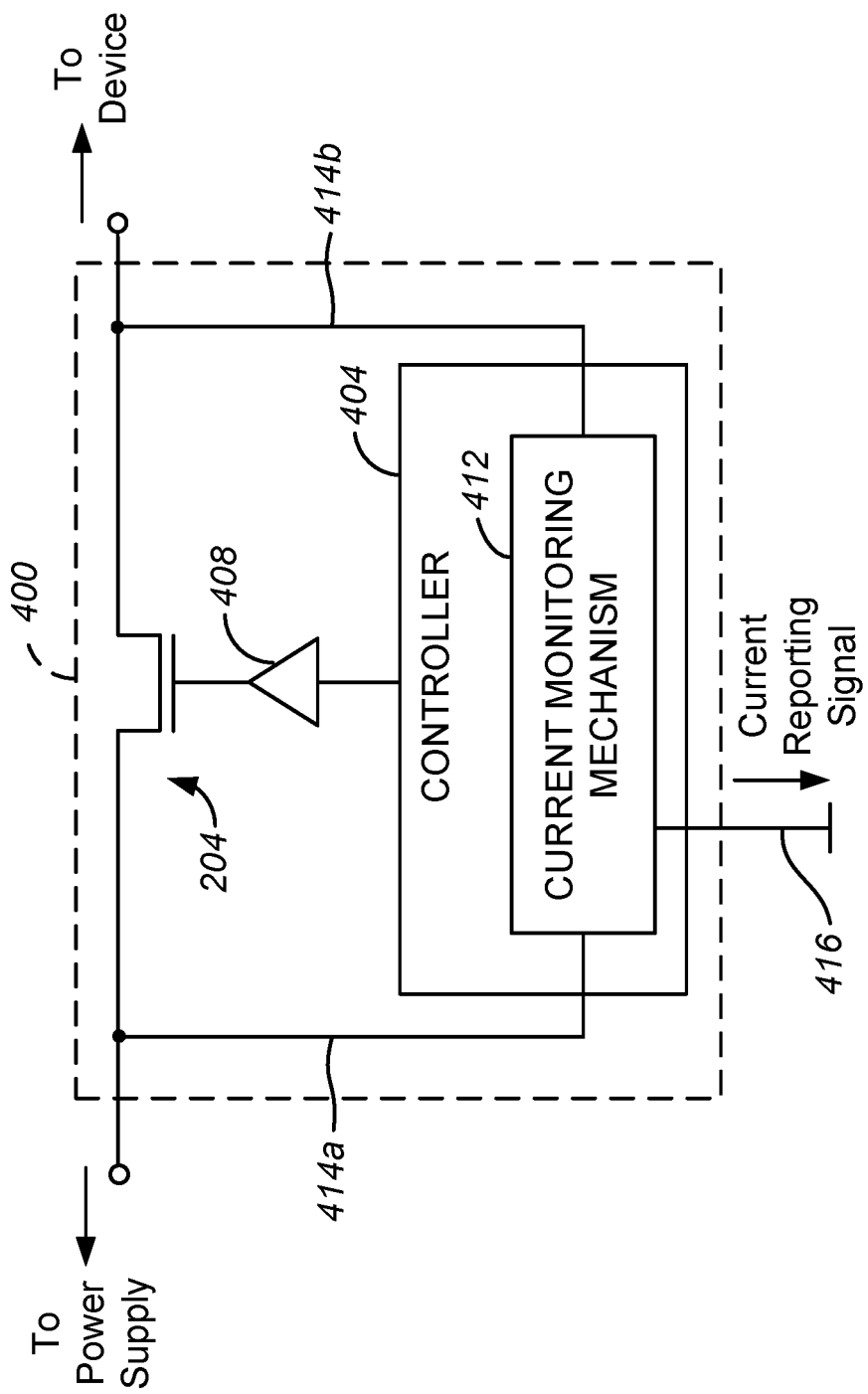
FIG. 4A is a simplified diagram of components of an integrated protection and monitoring device 400 for current monitoring and reporting, according to one or more embodiments of the invention.

FIG. 4A is a simplified diagram of components of an integrated protection and monitoring device 400 for current monitoring and reporting, according to one or more embodiments of the invention. In FIG. 4A, the switching mechanism 204 is integrated with a controller 404 and a driver 408 in a unit, for instance, on the same chip. In this example, the controller 404 includes a current monitoring mechanism 412 configured to provide current sensing and current reporting services. That is, the current monitoring mechanism 412 has a first input 414a coupled at a node between the power supply and switching mechanism 204 and a second input 414b coupled at a node between the switching mechanism 204 and the device to be powered. These current sensing inputs 414a and 414b are coupled to sense a current being provided from the power supply to the device. The current monitoring mechanism 412 is configured to generate a current reporting signal, which is indicative of the current sensed across the switching mechanism 204.

In FIG. 4A, the driver 408 is coupled between controller 404 and the gate of a FET of switching mechanism 204. This driver 408 is operatively coupled to drive the gate of switching mechanism 204 responsive to a control output from controller 404 indicating whether switching mechanism 204 is to be switched on or off. The driver 408 can form an integral part of controller 404, in some implementations, or driver 408 can be a separate component as illustrated in FIG. 4A. In this example, driver 408, controller 404, and switching mechanism 204 are fabricated on the same die. The driver 408 can be implemented as an analog or digital buffer, for instance, when switching mechanism 204 is implemented as a FET. In other implementations, when switching mechanism 204 is implemented as a BJT, the driver 408 can be implemented as a base current driver.

Figure 4B:
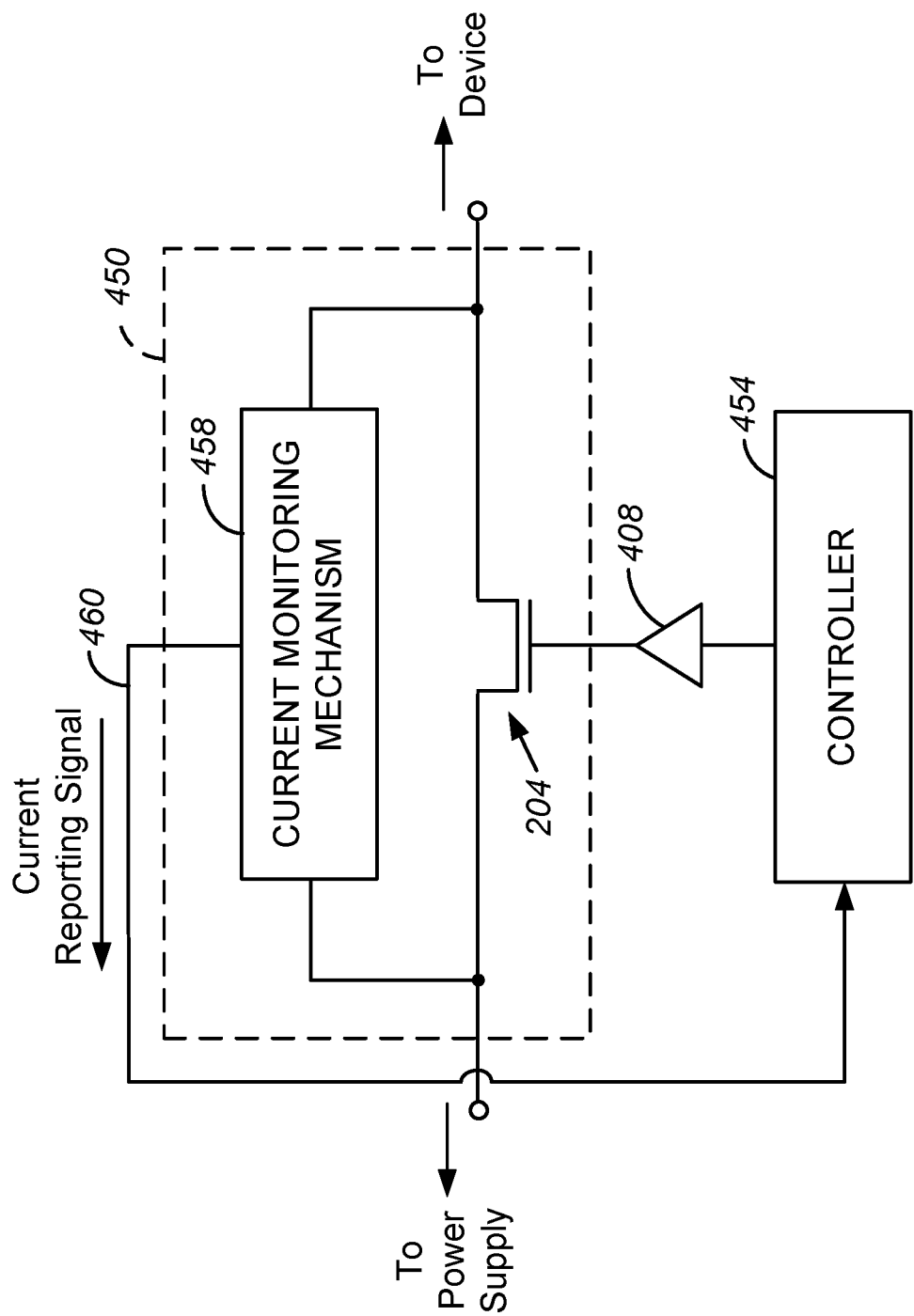
FIG. 4B is a simplified diagram of components of an integrated protection and monitoring device 450 for current monitoring integrated with a switching mechanism, according to one or more embodiments of the invention.

FIG. 4B is a simplified diagram of components of an integrated protection and monitoring device 450 for current monitoring integrated with a switching mechanism, according to one or more embodiments of the invention. In the example of FIG. 4B, in contrast with FIG. 4A, the switching mechanism 204 is integrated with current monitoring mechanism 458 in a unit, such as a single chip, but a controller 454 and driver 408 are not part of the unit, i.e., off-chip. In this example, the current monitoring mechanism 458 is configured to provide current sensing similar to current monitoring mechanism 412 of FIG. 4A, and as generally described above. The current monitoring mechanism 458 provides a current reporting signal at an output 460 to controller 454, so controller 454 can determine whether to switch off or switch on the switching mechanism 204 using driver 408 in response to the current reporting signal.

In FIG. 4B, the driver 408 is coupled between controller 454 and the gate of a transistor of switching mechanism 204, as in FIG. 4A. The driver 408 can be external to integrated protection and monitoring device 450, as illustrated, or in other examples, can form an integral part of device 450. In the example illustrated in FIG. 4B, current monitoring mechanism 458 and switching mechanism 204 are fabricated on the same substrate, while controller 454 and driver 408 are fabricated on a different substrate. The device 450 can be packaged with controller 454 and driver 408 in some implementations.

Figure 5:
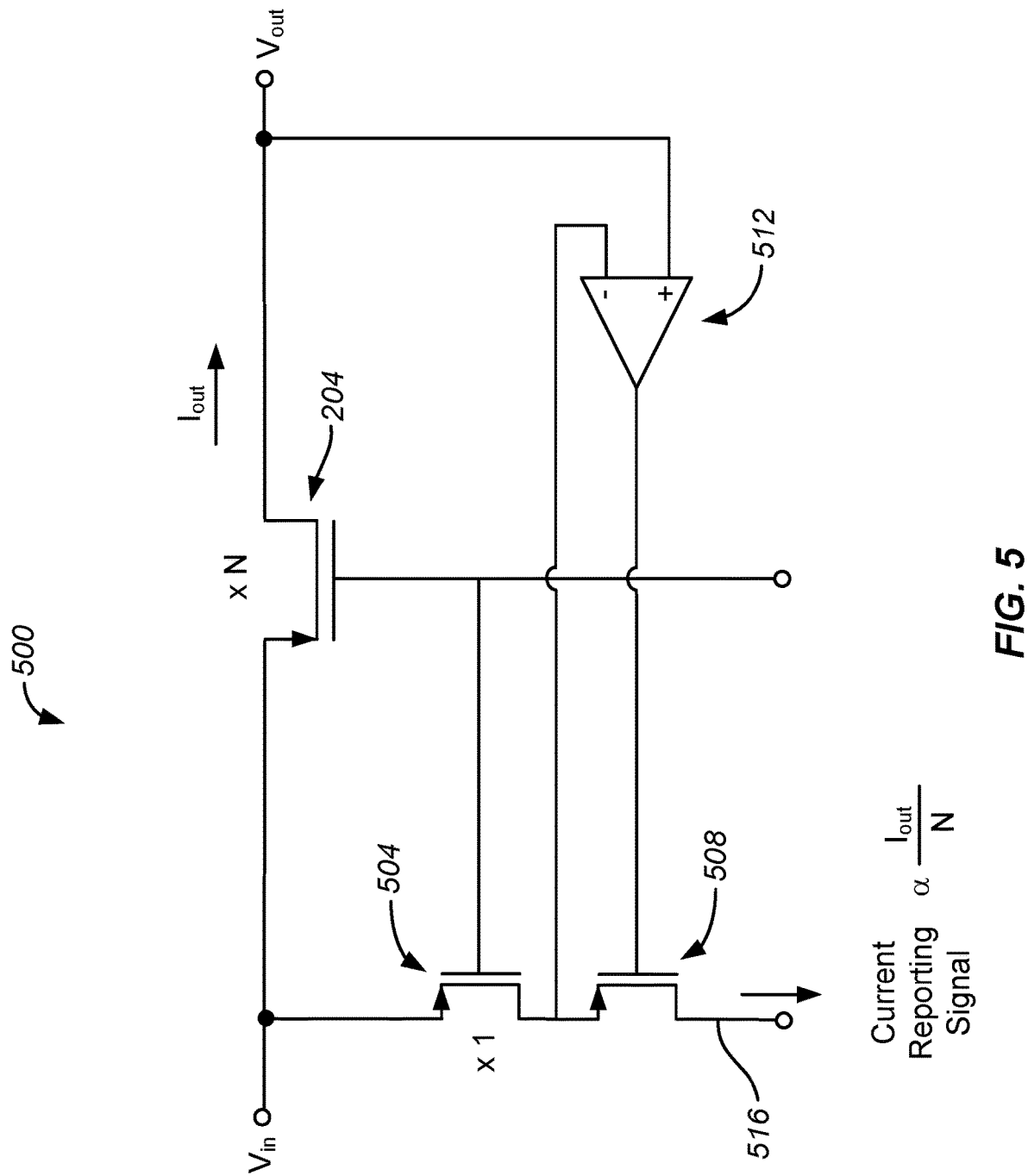
FIG. 5 is a simplified diagram of components of a current monitoring and reporting device 500 with a current mirror mechanism, according to one or more embodiments of the invention.

FIG. 5 is a simplified diagram of components of a current monitoring and reporting device 500 with a current mirror mechanism, according to one or more embodiments of the invention. In FIG. 5, the device 500 includes one implementation of a current monitoring mechanism as described above, such as current monitoring mechanism 412 of FIG. 4A or current monitoring mechanism 458 of FIG. 4B. In this example, the current monitoring mechanism includes a current mirror circuit implemented with two FETs 504 and 508 and an amplifier 512. The FETs 504 and 508 are configured as P-channel FETs in this implementation. The FETs in device 500 can alternatively be configured as N-channel FETs in other implementations. Here, the current mirror mechanism includes a reference FET 504 matched to the FET of switching mechanism 204, for instance, by fabricating the reference FET 504 on the same substrate as the FET of switching mechanism 204. For example, the reference FET 504 can have a similar channel structure and configuration as the FET of switching mechanism 204.

In the example of FIG. 5, the reference FET 504 is smaller than switching mechanism 204. This scale can be realized in terms of the relative sizes of reference FET 504 and the FET of switching mechanism 204. For example, the switching mechanism 204 FET has a relative scale of "N" times the scale of reference FET 504. This "N" value can signify the relative amounts of gate length of the respective FETs. By using matched FETs in this example, the respective current densities of reference FET 504 and the FET of switching mechanism 204 are similar. However, the smaller scale of reference FET 504 results in the current passing through reference FET 504 being significantly smaller than the current passing through switching mechanism 204.

In FIG. 5, the gate of reference FET 504 is coupled to the gate of the FET of switching mechanism 204. In this way, the gate potentials of reference FET 504 and switching mechanism 204 are the same, and the similar channel structures of reference FET 504 and the switching mechanism 204 FET allow the resistances of the respective FETs to track one another over variations in temperature and fabrication processes.

In FIG. 5, the current monitoring mechanism further includes a FET 508. An amplifier 512, such as an op-amp, has an output coupled to the gate of FET 508. The FET 508 is coupled to cooperate with amplifier 512 to keep the voltage across the source and drain of reference FET 504 the same as the voltage across the source and drain of the FET of switching mechanism 204. In particular, the amplifier 512 has one input coupled to a node between reference FET 504 and FET 508. The amplifier 512 has a second input coupled to an output voltage, Vout, representing the voltage at a node between switching mechanism 204 and a device 108 to be powered. The output of amplifier 512 is coupled to the gate of FET 508 to drive the gate voltage of FET 508. The reference FET 504 has an input coupled to an input voltage, Vin, representing the voltage between the power supply 104 and the switching mechanism 204. The amplifier 512 cooperates with FET 508 to drive the output of reference FET 504 to the output voltage, Vout. By driving the voltage across the source and drain of the reference FET 504 to be the same as the voltage across the source and drain of the FET of switching mechanism 204, and knowing that the reference FET 504 has a scale of ×1 while switching mechanism 204 has a scale of ×N, the current provided through reference FET 504 and output at port 516 as the current reporting signal will generally have the same scale ratio of 1/N. That is, the current reporting signal output at port 516 will generally be proportional to an output current, Iout, provided through switching mechanism 204, divided by the scale ratio, N.

Returning to FIGS. 4A and 4B, such a scaled current provided as the current reporting signal can be used by controller 404 or controller 454 to determine whether to switch off the switching mechanism 204 via driver 408. That is, in one example, a threshold can be set so that when the scaled current output from port 516 of FIG. 5 meets or exceeds such a threshold, the controller 404 or 454 is triggered to cause the switching mechanism 204 to switch off. This comparison can be performed on the scaled output current or a processed version of the output current. In some examples, the output current from port 516 can be mirrored, scaled or otherwise processed, and then provided to a current comparator for comparison with a threshold current.

In FIG. 4A, the integrated protection and monitoring device 400 including controller 404 with current monitoring mechanism 412 as well as switching mechanism 204 and driver 408 can be implemented in a chip of a significantly smaller size than embodiments incorporating an external sense resistor for current monitoring, for example, as shown in system 200 of FIG. 2. Thus, using the integrated unit 400 in some implementations can result in significant savings in chip real estate.

Various components can be coupled to receive and process reporting signals as disclosed herein. The further processing of such reporting signals can provide additional control and operations of the systems described herein as well as further systems and components. FIGS. 6A-6F are simplified diagrams of components for processing and using reporting signals, according to one or more embodiments of the invention. In some embodiments, the various components of FIGS. 6A-6F can be integrated on-chip with the switching mechanism. In some embodiments, one or more of these components can be integrated as units of the controller, which can be integrated with the switching mechanism, for instance, in the form of a flip chip as described in greater detail below.

Figure 6A:
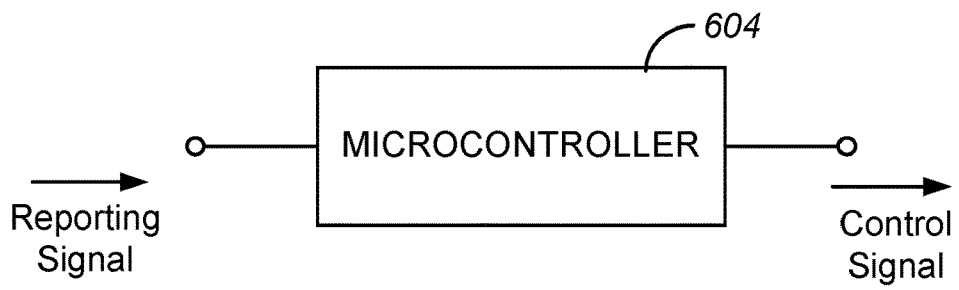
FIGS. 6A-6F are simplified diagrams of components for processing and using reporting signals, according to one or more embodiments of the invention.

For instance, FIG. 6A shows a microcontroller 604 coupled to sense a current reporting signal, for example, received from current monitoring mechanism 458 of FIG. 4B. For example, microcontroller 604 of FIG. 6A can serve as at least a part of controller 454 of FIG. 4B. The microcontroller 604 of FIG. 6A is configured to output a control signal based on the received reporting signal. In this example, the reporting signal can be an analog current signal, an analog voltage signal, as well as a digital signal or other form of communication. When the reporting signal is an analog signal, the microcontroller 604 can incorporate an analog-to-digital (A/D) converter at the input where the reporting signal is received. The control signal output from microcontroller 604 could be provided to the switching mechanism, as well as other various devices, mechanisms, and components in a larger system. In this way, for example, when the input reporting signal indicates that a system fault condition has occurred, microcontroller 604 is configured to cause the switching mechanism to go to the off state and communicate this condition to further devices, mechanisms, and components via the control signal. For example, the control signal can instruct such additional devices, mechanisms, and components to switch off to prevent further damage or over-heating of system components.

Figure 6B:
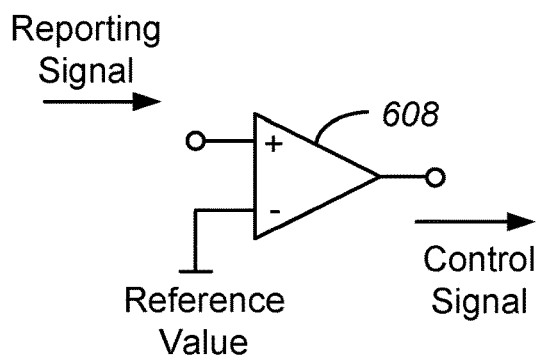

In FIG. 6B, another further component, which can be coupled to receive the reporting signal, is a comparator 608. In this example, comparator 608 has a first input coupled to sense the reporting signal and a second input coupled to a reference value. For example, when the reporting signal is in the form of an analog current, the reference value can be in the form of a reference current. In FIG. 6B, the comparator 608 is configured to compare the reporting signal with the reference value and output a control signal based on this comparison, for instance, to cause the switching mechanism to switch off. The control signal can otherwise be used for similar purposes as described above with reference to microcontroller 604. Also, in FIG. 6B, the control signal can be delivered to additional processing units including further microcontrollers. These processing units can be coupled to control various additional devices, mechanisms, and components in an electronic system or device.

Figure 6C:
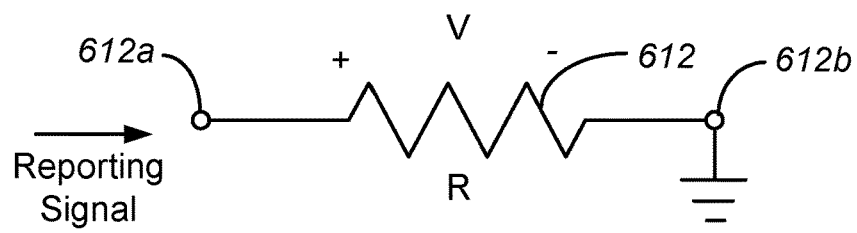

Additional capabilities, such as voltage mode current reporting, are contemplated. For instance, a current signal can be delivered to a resistor to produce a voltage; thus, one can scale the voltage to a useful level. Such a resistor can be internal or external. In some embodiments, such a voltage can be provided to an analog buffer or amplifier. By way of example, FIG. 6C shows a resistor 612 coupled to receive the reporting signal. For instance, resistor 612 can be used in situations in which the reporting signal is in the form of an analog current. In this case, resistor 612 will generate a voltage, V, across the resistor responsive to the analog current. This voltage, V, can be compared to a designated threshold, such as a reference voltage, to make further control determinations as described above with reference to FIGS. 6A and 6B. The resistor 612 has an input terminal 612a coupled to receive the reporting signal and an output terminal 612b coupled to ground, in this example, or coupled to a different voltage reference, in other examples.

Figure 6D:
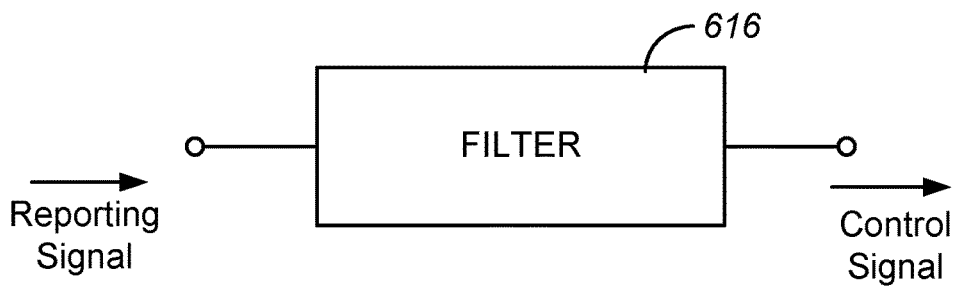

In another example, FIG. 6D shows a filter 616 coupled to sense the reporting signal. The filter 616 is configured to determine a differential in the reporting signal and output a control signal based on the determined differential. For example, filter 616 can be configured to provide analog filtering, in which a sharp load spike indicated by the reporting signal will cause a control signal to be generated to cause a first action or event to occur, while a slower or gradual increase or decrease in current indicated by the reporting signal will result in a control signal being output by filter 616 associated with a second event or action.

Figure 6E:
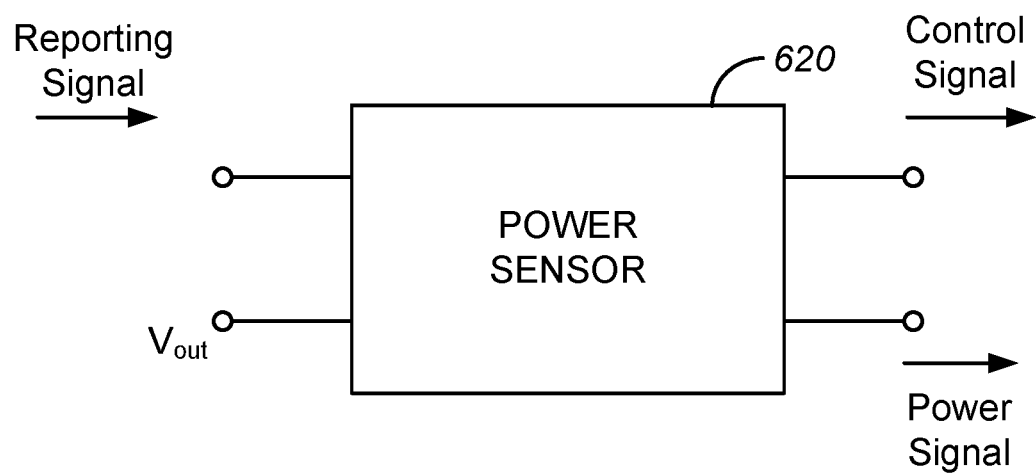

In FIG. 6E, in another example, a power sensor 620 has a first input coupled to receive the reporting signal and a second input coupled to sense a voltage, such as Vout of FIG. 5, that is, the voltage sensed at a node between switching mechanism 204 and the device 108 to be powered. In this example, the power sensor 620 is configured to determine a power signal based on the reporting signal and the output voltage and output a control signal based on the determined power signal. For example, power sensor 620 can be configured to multiply a current value represented by the reporting signal with the Vout voltage and output this power calculation as the power signal. The resulting power signal can be used by the controller to switch off the switching mechanism, for instance, when it is determined that the sensed power represented by the power signal meets or exceeds a designated threshold value, as described in greater detail above. The control signal can include information, for instance, in digital form, indicating that certain devices or components of the system should be powered down when the calculated power signal exceeds a certain level. In this example of FIG. 6E, both the control signal and the power signal generated by the power sensor 620 are provided at separate output ports for further processing.

Figure 6F:
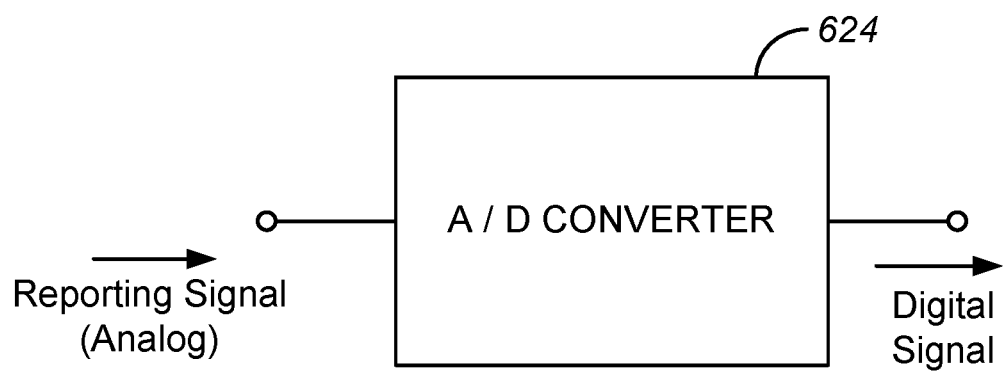

In FIG. 6F, in another example, an analog-to-digital (A/D) converter 624 is coupled to sense a reporting signal in analog form. The A/D converter 624 is configured to convert this analog reporting signal to a digital output signal for further processing. For instance, the digital output signal could be provided to a further processor, such as microcontroller 604 of FIG. 6A for further determinations.

Any of the various components illustrated in FIGS. 6A-6F can be integrated with the other various components described above, including the monitoring mechanisms, controllers, and/or switching mechanisms of FIGS. 1-5. In some implementations, the components of FIGS. 6A-6F are not integrated with these other components and are implemented in separate units or chips in a system. The integration or non-integration of the components of 6A-6F will depend on the desired implementation of the various devices and systems in which such components can be included.

Figure 7:
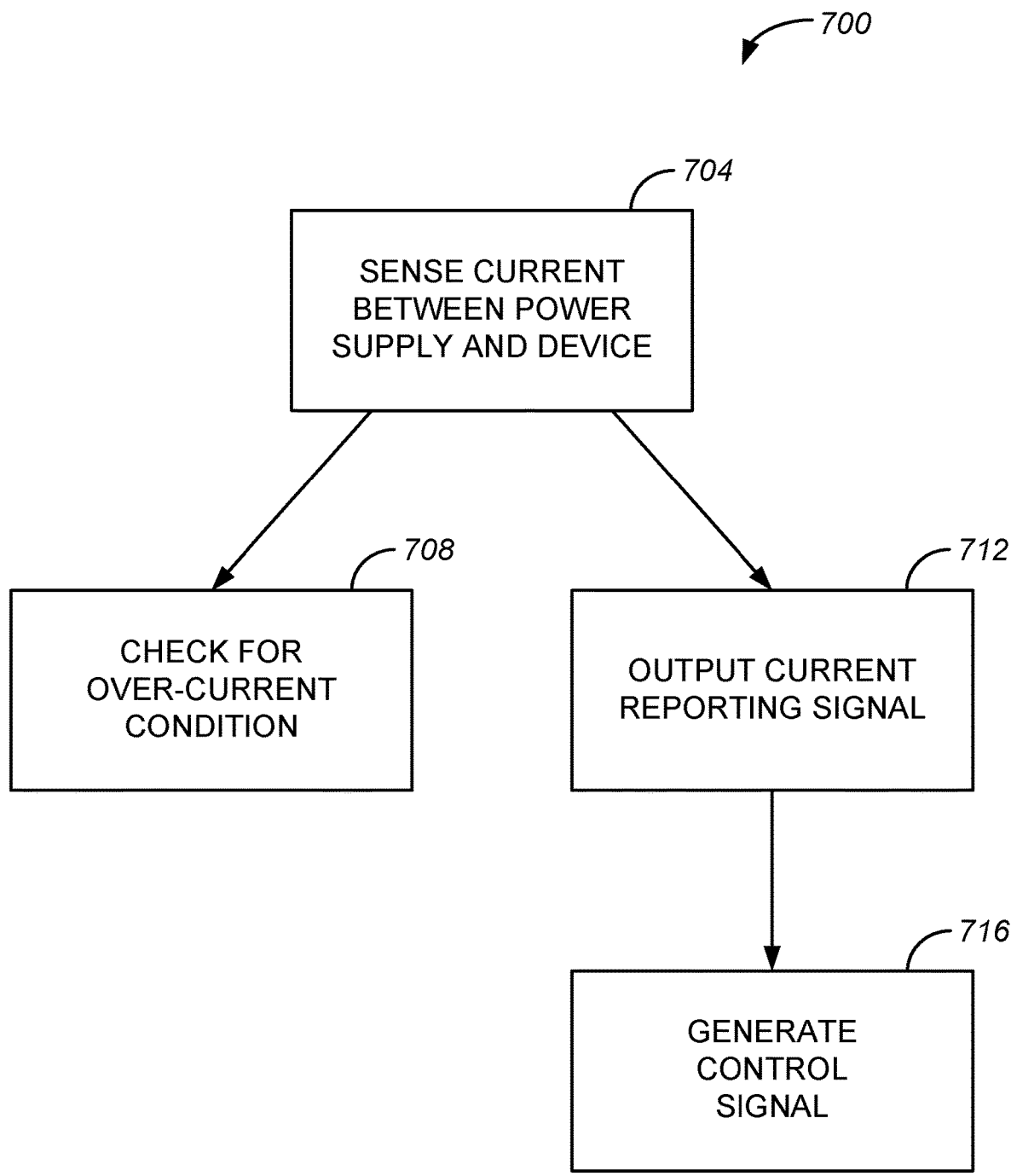
FIG. 7 is a simplified flow diagram of a process 700 for current monitoring and reporting in relation to a protection and monitoring device, according to one or more embodiments of the invention.

FIG. 7 is a simplified flow diagram of a process 700 for current monitoring and reporting in relation to a protection and monitoring device, according to one or more embodiments of the invention. In FIG. 7, process 700 begins in block 704, in which one or more monitoring mechanisms as described above, such as a current monitoring mechanism, senses an electrical characteristic such as current along a current path between a power supply and a device. Process 700 proceeds from block 704 to concurrent processing blocks 708 and 712. In block 708, hardware such as a comparator in the controller is configured to check the current being provided along the current path between the power supply and the device for an over-current event, for instance, by comparing the sensed current with a reference current. Concurrent with this check, the current monitoring mechanism of the controller is configured to output a current reporting signal in block 712 responsive to the sensed current in block 704. This current reporting signal is indicative of the sensed current and can be provided to various components for additional determinations and operations, as described above. For example, the current reporting signal can be provided to a microcontroller 604, as described above with respect to FIG. 6, and the microcontroller can generate a suitable control signal in block 716 to cause the switching mechanism to switch off.

In FIG. 7, when a current monitoring mechanism is checking in block 708 for an over-current event while providing a current reporting signal in block 712, the controller can separately determine whether to cause the switching mechanism to switch off responsive to the sensed current. In addition, simultaneous with the monitoring in block 708 and providing of a current reporting signal in block 712, a controller as disclosed herein can also provide additional services, such as temperature sensing. For instance, the controller can be coupled to a temperature sensor as described above to determine whether the temperature of the switching mechanism has exceeded a designated threshold indicating an over-heating event, in which case the controller can cause the switching mechanism to switch off. Reaching the temperature threshold can also indicate that too much power being dissipated.

Figure 8A:
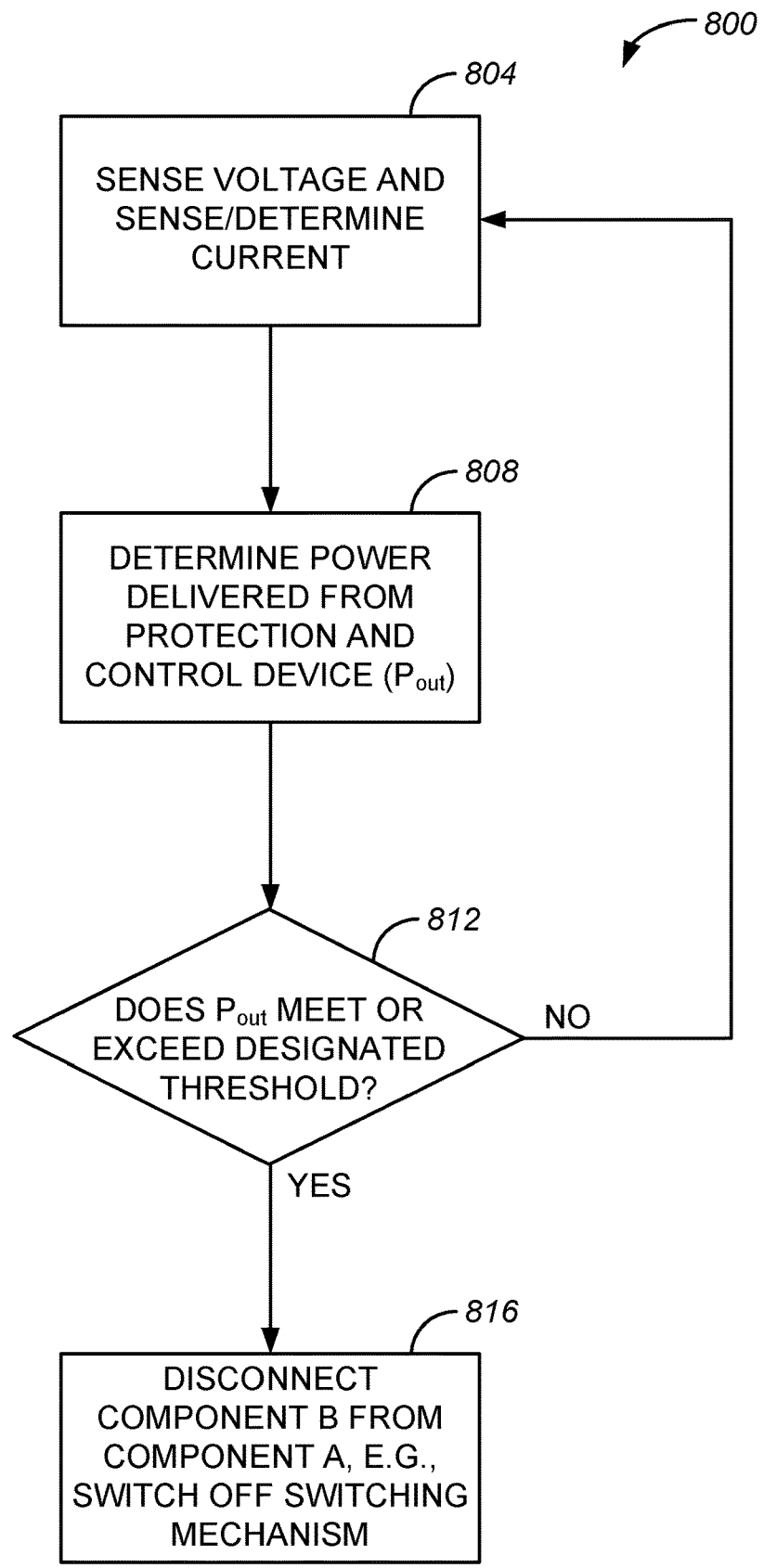
FIG. 8A is a simplified flow diagram of a process 800A for integrated protection, monitoring, and control based on power measurements, according to one or more embodiments of the invention.

FIG. 8A is a simplified flow diagram of a process 800 for integrated protection, monitoring, and control based on power measurements, according to one or more embodiments of the invention. Concurrent reporting signals can be omitted, in some embodiments, and can be included, in some other embodiments.

In FIG. 8A, process 800 begins in block 804, in which a voltage and a current are sensed/determined as described above. For instance, in FIG. 3B, Vout and Iout can be sensed as described above. Alternatively, the sensed current can be a scaled version of Iout, as described above with reference to FIG. 5.

In FIG. 8A, process 800 proceeds from block 804 to block 808, at which the power, Pout, is calculated based on the sensed voltage and current. For instance, Pout can be determined by the power measuring mechanism 370 of FIG. 3B. In another example, the Pout calculation can be based on a current reporting signal and a sensed Vout by power sensor 620 of FIG. 6E, where the determined Pout value is output in the form of a power signal. In block 812, the calculated Pout value is compared with a designated threshold. When Pout does not meet or exceed the threshold, process 800 returns to block 804. When Pout meets or exceeds the threshold, process 800 proceeds to block 816, in which the integrated protection and monitoring device, such as device 112 of FIG. 1A, can disconnect components 102 and 106 from one another. For instance, a control signal output by power sensor 620 in FIG. 6E can indicate that controller 358 of FIG. 3B is to switch off switching mechanism 204.

While FIG. 8A is described and illustrated as a sequence of processing blocks, those skilled in the art should understand that the blocks are often performed simultaneously. For instance, in some implementations, voltage and/or current is continuously or repeatedly sensed over time in block 804 without waiting for other operations to be carried out, such as power calculations and comparisons in blocks 808 and 812. Because voltage and/or current can be continuously sensed in block 804, operations including the determination in block 808 and comparison in block 812 can also be continuously or repeatedly performed concurrent with one another and concurrent with the ongoing sensing in block 804.

Figure 8B:
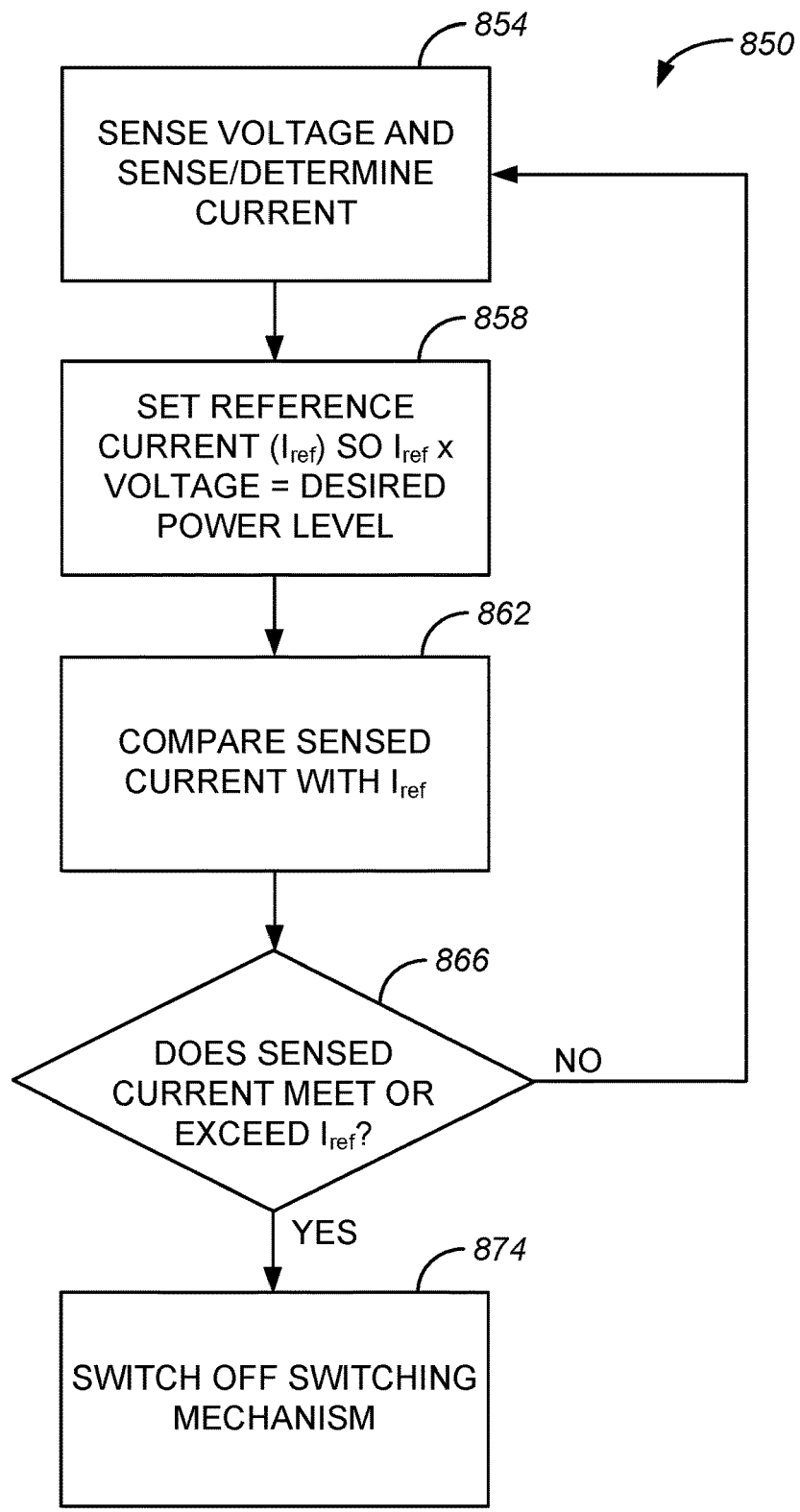
FIG. 8B is a simplified flow diagram of a process 800B for integrated protection, monitoring, and control based on voltage and current measurements, according to one or more embodiments of the invention.

FIG. 8B is a simplified flow diagram of a process 850 for integrated protection, monitoring, and control based on voltage and current measurements, according to one or more embodiments of the invention. In FIG. 8B, process 850 begins in block 854, in which a voltage such as Vin or Vout, and a current such as Iout, as described above, are sensed/determined as described herein.

In FIG. 8B, process 800 proceeds from block 854 to block 858, at which a reference current, Tref is set such that Iref*(input or output voltage level)=a desired power level of the system, particularly the component to be powered. For instance, if the desired power level is 240 VA, and Vin or Vout is changed, Tref can be changed accordingly to maintain the 240 VA power level. In block 862, the sensed current of block 854 is compared with Tref. In block 866, when the sensed current does not meet or exceed Tref, process 850 returns to block 854. When the sensed current meets or exceeds Tref, process 850 proceeds to block 874, in which the switching mechanism switches off, as explained in the various embodiments above.

As with FIG. 8A, those skilled in the art should understand that the processing blocks of FIG. 8B are often performed simultaneously. In some implementations, voltage and/or current is continuously or repeatedly sensed over time in block 854 without waiting for other operations to be carried out, such as setting the reference current in block 858 and comparing currents in block 862. Operations including the setting in block 858 and comparison in block 862 can be continuously or repeatedly performed concurrent with one another and concurrent with the ongoing sensing in block 854.

Depending on the desired implementation, different devices, apparatus, circuits, components, mechanisms, and/or units described herein can be fabricated so that they share the same substrate, e.g., are on the same die or chip. In an alternative implementation, such devices, apparatus, circuits, components, mechanisms, and/or units can be fabricated on different substrates, e.g., on different chips. In various implementations, such devices, apparatus, circuits, components, mechanisms, and/or units can be provided in the same or different packages. For instance, in FIG. 4A, an integrated controller 404 and switching mechanism 204 fabricated on a first die could be interconnected with a power supply as described above and provided in the same package. Various additional electronic components such as those illustrated in FIGS. 6A-6F could be integrated, e.g., fabricated on the same die as current monitoring mechanism 412 and switching mechanism 204 in some implementations. In another example, a controller as shown in FIGS. 2-4 could be implemented as a discrete controller separate from other devices, circuits, switches, mechanisms and components in the embodiments described herein.

In some implementations, various devices, apparatus, circuits, components, mechanisms, switching mechanisms (such as a load switch) and/or units can be integrated and packaged as a flip chip integrated circuit (IC). The flip chip IC can incorporate other integrated circuitry and/or microelectromechanical systems (MEMS) devices and circuits, depending on the desired implementation. The flip chip IC can be connected to external circuitry and/or other chips or wafers with solder bumps that have been deposited onto contact pads of the flip chip.

The responses to possible system fault conditions can vary, depending on the particular implementation. For instance, in some embodiments, a controller switches off the switching mechanism as soon as an over-current, over-voltage, over-power, and/or over-temperature event is detected by one or more monitoring mechanisms, in near-real time. In some embodiments, a reporting signal output from a monitoring mechanism is processed, for example, by a filter. Such a filter can be coupled to receive the reporting signal, such as a current reporting signal, and filter the reporting signal before delivery to the controller. In other implementations, the filter is incorporated in the controller. The controller's determination of whether to switch off the switching mechanism can be based on the controller performing various electrical operations on the reporting signal, including but not limited to filtering. For instance, when an over-current event indicating a possible overload condition is first detected, the controller can be programmed to wait and check whether the over-current event still exists after a specified delay period, for instance, on the order of a matter of microseconds or milliseconds. In some other embodiments, there can be two or more designated thresholds that are satisfied before the controller determines that a system fault condition exists and switches off the switching mechanism. For example, when the monitored electrical characteristic, e.g., voltage, current, and/or power, meets or exceeds a first threshold but not a second threshold, the controller can be configured to generate a warning signal without switching off the switching mechanism. In this example, the controller does not switch off the switching mechanism until the magnitude of the monitored electrical characteristic exceeds both the first and second thresholds.

In some embodiments, a monitoring mechanism of an integrated protection and monitoring device (IPAMD) as described herein actively monitors electrical characteristics such as voltage, current, and/or power delivered from a switching mechanism to a load such as component 388 in FIG. 3D continuously, including during start-up and/or reset of the IPAMD. For instance, if at any time delivered power meets or exceeds a first threshold such as 240 VA, the controller of the IPAMD initiates a fault timer with a user-programmable time-out. For instance, the IPAMD can be configured to have more than one selectable time-out period. An external resistor can be coupled to a pin of the chip in which the IPAMD is implemented to program the time-out period. In some implementations, if power drawn by the load exceeds the first threshold for the entire time-out period, but the magnitude of the power draw is less than a second threshold, which can similarly be a programmable setting, the switching mechanism will not be switched off until the end of the time-out period. If this over-power event ends before the expiration of the time-out period, the timer will be reset, and the controller will not switch off the switching mechanism in response to the over-power event. In some instances, the switching mechanism will not be switched off unless the voltage, current, and/or power drawn by the load exceeds both the first threshold and the second threshold at some moment during the time-out period. In some instances, switch-off occurs in response to the drawn voltage, current, and/or power exceeding both thresholds for the entire time-out period or some designated fraction thereof. In some other implementations, the switching mechanism is not switched off until both the first and the second thresholds are exceeded, regardless of any time-out period. As described above, a reporting signal output from the IPAMD can indicate whether the first and/or the second thresholds have been met or exceeded at any given time.

In some embodiments, the IPAMD can be configured to offer several moderate time-out periods programmed by an external resistor. For instance, if the load current in the path of the switching mechanism exceeds a first threshold for the entire time-out period, but the load current magnitude is less than a second threshold, the switching mechanism will be switched off at the end of a selected one of the time-out periods, and the current reporting signal will indicate a moderate fault condition. The first current threshold and/or the second current threshold can be externally programmable through a resistor connected to a pin on the chip having the IPAMD. In some embodiments, the control circuitry supports on-the-fly threshold adjustments, as further described herein. For example, the current threshold can be changed during operation of the IPAMD.

Some embodiments of IPAMDs and processes disclosed herein can incorporate various additional services, including self-diagnostics and thermal device protection during start-up. With a self-diagnostic process, the IPAMD attempts to determine whether the switching mechanism is shorted or has already failed. For instance, in FIG. 5, circuitry can be incorporated to check Vin and Vout at start-up. During start-up, if the switching mechanism is supposed to be switched off, and there is a significant voltage at Vout, the self-diagnostic process can determine that there is a switching mechanism short or other failure. A self-diagnostic process can be performed at each restart of the IPAMD, in some implementations.

Figure 8C:
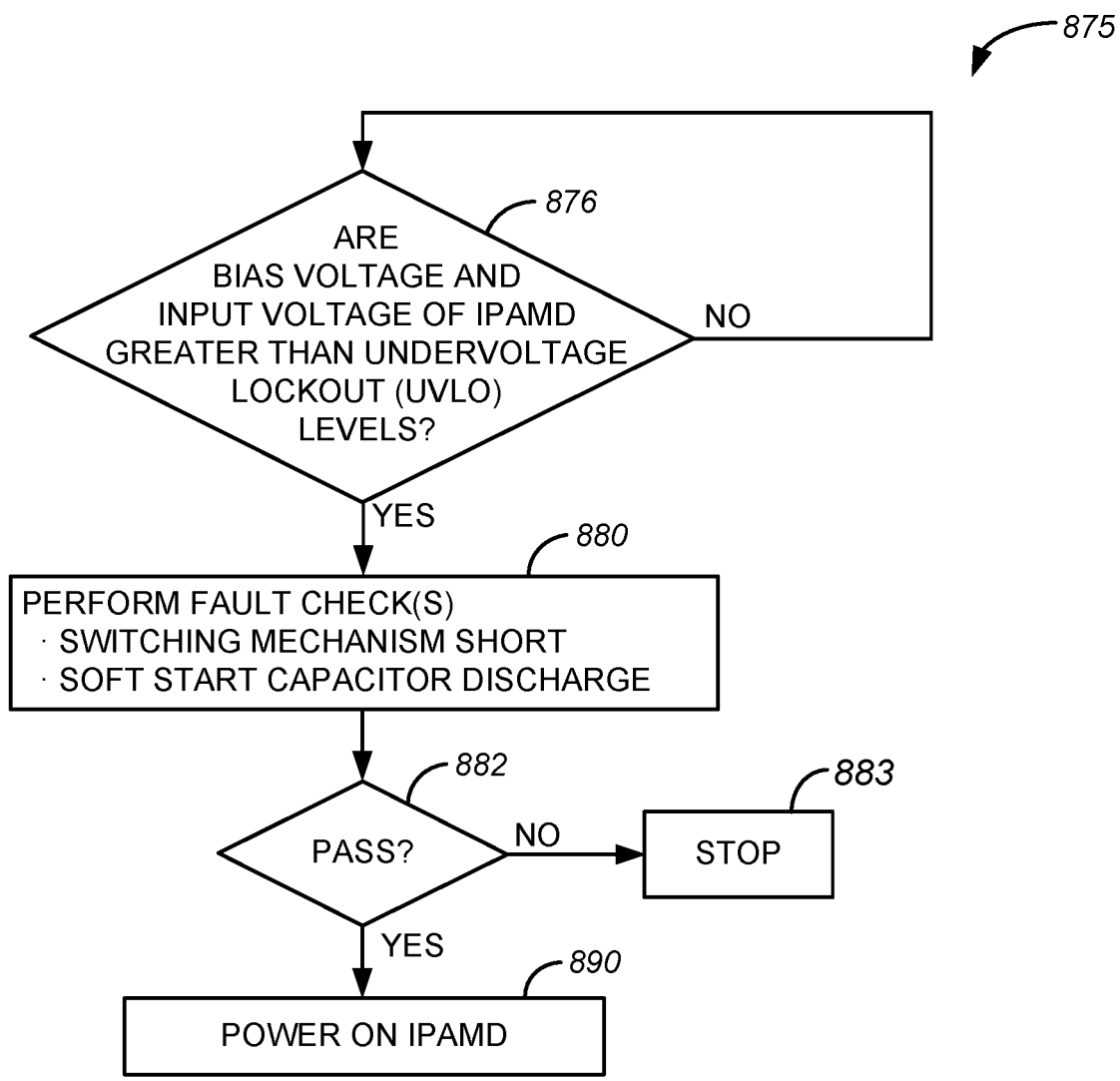
FIG. 8C is a simplified flow diagram of a start-up process 875 for an integrated protection and monitoring device, according to one or more embodiments of the invention.

In some implementations, a start-up process for the IPAMD is provided. FIG. 8C is a simplified flow diagram of a start-up process 875 for an IPAMD, according to one or more embodiments of the invention. In one example, the IPAMD can be configured to initiate a start-up sequence only when certain prerequisite conditions are satisfied. For instance, in block 876, it is determined whether a bias power supply voltage on a pin of the chip in which the IPAMD is incorporated, such as 3.3 volts, is above a bias undervoltage lockout level (UVLO). For instance, the bias power supply voltage can be delivered to the chip to power internal control circuitry, such as a controller and/or monitoring mechanism of the IPAMD. Another condition that can be checked in block 876 is whether an input voltage (Vin) to the IPAMD from a first component such as a power supply 104 of FIG. 1B, such as 12 volts, is above an input voltage UVLO. In this example, only when the bias voltage and input voltage are greater than respective UVLOs, in block 876, the IPAMD proceeds to block 880. Otherwise, block 876 repeats. In some other examples, only one of the conditions of block 876 need to be satisfied for process 876 to proceed to block 880.

The IPAMD can be configured to perform one or more checking operations in block 880 to ensure that there are no faults. The checks of block 880 can include, by way of example, detection of possible shorts across the switching mechanism, and detection of possible leakage across capacitors including the soft-start capacitor. In one example, if a pass FET of the switching mechanism is shorted, it may not be possible to discharge a node at the output of the IPAMD when Vin is supplied. In this example, in block 882, if one or more of the checks of block 880 do not pass, e.g., there is a short across the switching mechanism and/or the soft start capacitor has not been discharged, the process 875 terminates in block 883.

In FIG. 8C, one way of detecting a switching mechanism short in block 880 is to discharge any charge at the output of the IPAMD, that is, at a node between the IPAMD output and a component to be powered. In some implementations, the IPAMD will keep the discharge active for a designated time. In some implementations, in block 880, the IPAMD can check for possible shorts across the switching mechanism by determining if the IPAMD output voltage, Vout, is below an internally-defined reference voltage on the chip, such as 8 volts. Vout refers to the voltage at a node between the IPAMD and the component to be powered, such as device 108 of FIG. 1B. If Vout is not below the reference, a potential switching mechanism short is registered, and the current reporting signal will indicate an overload condition. The overload condition can be latched and maintained until restart of the IPAMD. Returning to block 882, if no potential switching mechanism short or other fault is detected, the IPAMD will generally proceed with power-on in block 890.

The switching mechanism short test of block 880 can be disabled or enabled, for instance, by providing an appropriate input to a control pin on the chip. In some implementations, soft-start capacitor discharge can be performed during every restart. The IPAMD can be integrated with additional circuitry to discharge a discharge capacitor connected between the switching mechanism and ground to provide repeatable soft-start waveforms. In some implementations, during each restart, the IPAMD uses an integrated resistive element to discharge the discharge capacitor. Once the restart is initiated, the IPAMD will start a timer and discharge for a period of time. At the end of this period, the IPAMD will check if the voltage across the discharge capacitor is below a soft-start threshold, such as 0.4 volts. If this condition has been met, the IPAMD will be ready to initiate start-up. If the voltage across the discharge capacitor is not below the soft-start threshold, the IPAMD can switch the switching mechanism off and report an overload condition with the current reporting signal.

In some implementations, the checking operations of block 880 described above are performed during each restart. This check ensures proper IC configuration before start-up. During each restart, after the bias voltage is valid, the IPAMD will check for other fault conditions as described above. If a fault is identified, the IPAMD will report the fault using the current reporting signal. The fault condition will be latched until restart.

Returning to block 876, in some implementations, the IPAMD will not initiate a soft-start until a different set of conditions are met: bias voltage, input voltage, and soft-start capacitor voltage are above respective UVLOs; an on/off switch as described above with reference to FIG. 3C is receiving an appropriate enable signal; and other start-up checking operations as described herein are completed with no overload condition(s) being detected.

Figure 9:
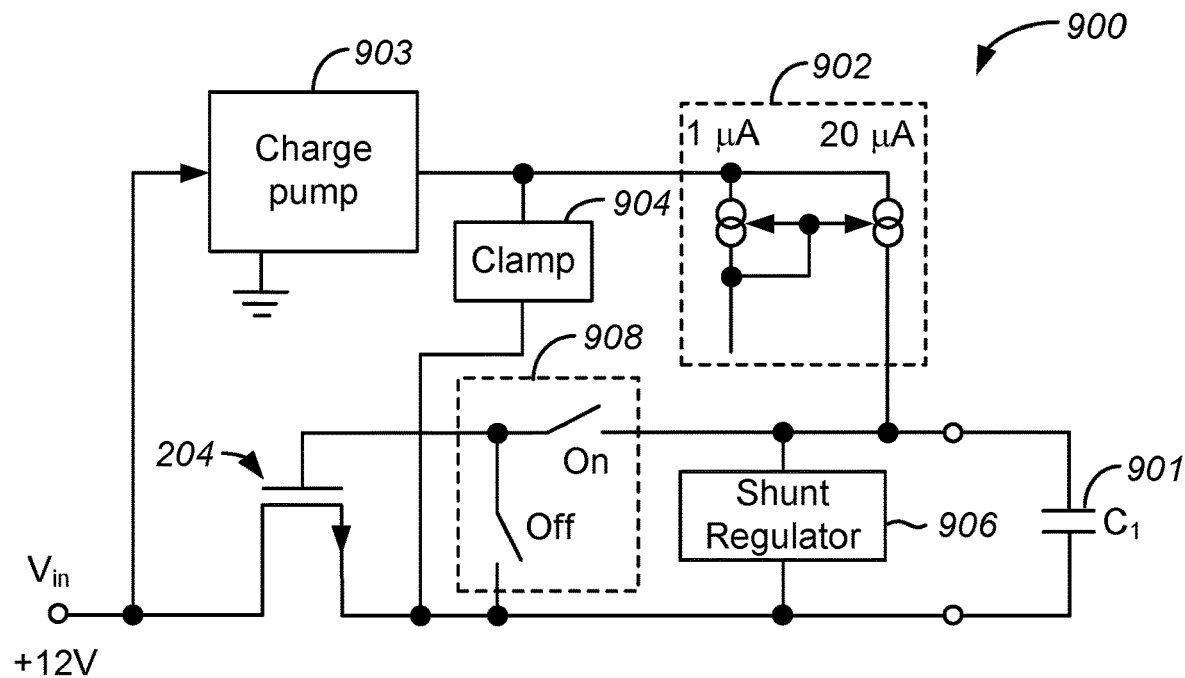
FIG. 9 is a simplified diagram of circuitry 900 for driving a switching mechanism, according to one or more embodiments of the invention.

FIG. 9 shows circuitry 900, which can be used in some embodiments to drive a switching mechanism. This circuitry can be incorporated in an integrated protection and monitoring device, as shown in FIGS. 1A and 1B. For example, the circuitry of FIG. 9 can be included in a controller as shown in FIG. 3A or FIG. 3B.

The circuitry of FIG. 9 shows one example of a switching mechanism 204 in the form of an N-channel MOSFET to be coupled between a power supply providing a voltage of Vin (+12 V in this example) and a device to be powered, represented by capacitor 901 having a capacitance of $C_1$. A current source 902, variable between 1 microamp and 20 microamps in this example, is provided and connected as shown in FIG. 9, and a charge pump 903 has an input coupled to receive Vin and an output coupled to a clamp circuit 904. The charge pump 903 can be configured to be powered by any of various supply voltages, depending on the desired implementation. The clamp 904 at the output of the charge pump 903 is configured to clamp the charge pump output voltage below a designated value, which can be set to achieve long term reliability of the circuitry. The clamp 904 has an output coupled to the gate of the MOSFET of switching mechanism 204. A shunt regulator 906 is coupled in parallel with capacitor 901. The shunt regulator 906 is coupled to regulate the voltage driving the gate of the MOSFET of switching mechanism 204. An on-off switch 908 is operatively coupled to switch the gate of the MOSFET of mechanism 204 on or off. That is, when the MOS- FET is switched off, the switch 908 connects the MOSFET's gate to its source. The MOSFET can be switched on by connecting the MOSFET's gate to the shunt regulator 906. The shunt regulator 906 can be programmed and trimmed to maximize performance of the switching mechanism 204.

Figure 10:
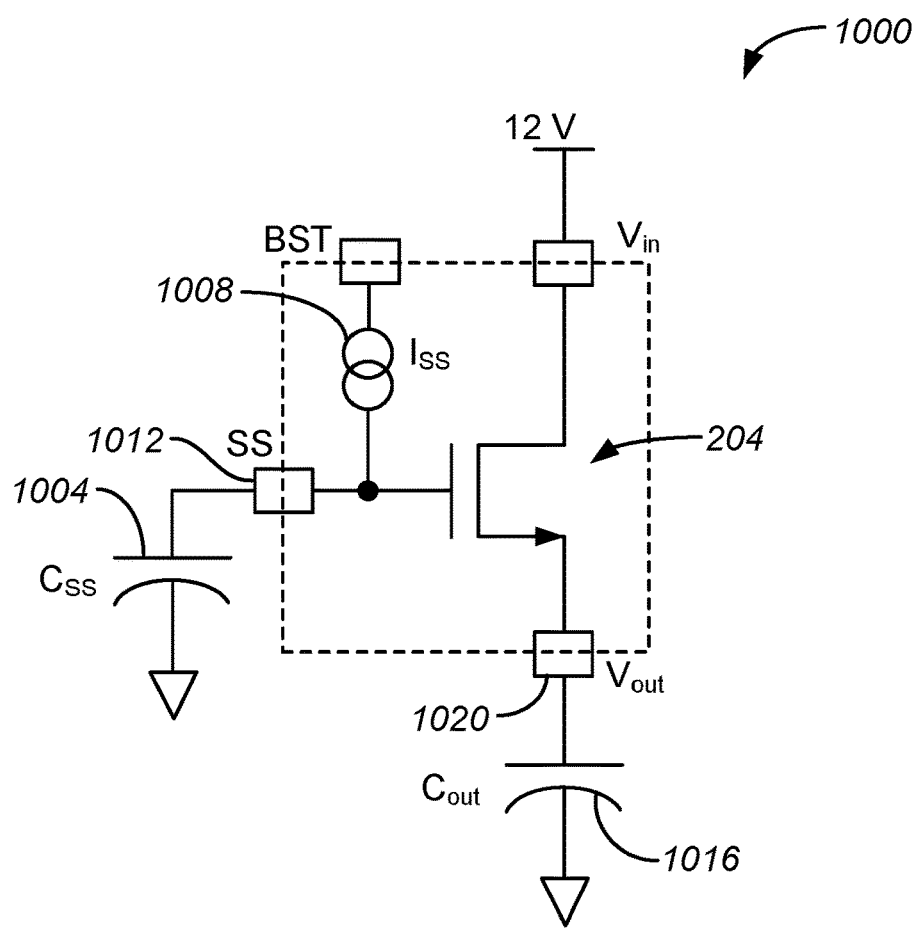
FIG. 10 is a simplified diagram of circuitry 1000 for driving a switching mechanism, according to one or more further embodiments of the invention.

An alternative circuit implementation to FIG. 9 is shown in FIG. 10. In one implementation, during start-up, a Css capacitor 1004 is charged using a constant current source 1008 providing a current Iss. In this example, the voltage at a soft-start (SS) node 1012 will rise linearly per the relationship in Equation 1 until the gate-source voltage of the FET of switching mechanism 204 reaches a voltage, V.

$$V = I_{SS} \times \frac{t}{C_{SS}} \qquad \text{Equation 1}$$

In this example, the illustrated FET of switching mechanism 204 is a pass FET. During start-up, the pass FET is operated as a source follower. As a result, the voltage at the output node 1020 of the integrated protection and monitoring device, Vout, will follow the linear and monotonic voltage ramp generated on the SS node 1012. Hence, Equation 1 can be used to calculate a soft-start time (Tss).

For Css values greater than a certain capacitance, Tss is mainly defined by the value of Css and the gate charging current Iss. Rearranging Equation 1 and substituting 12V for the final gate-source voltage, in this example, Equation 2 is obtained for Tss.

$$T_{SS} = \frac{12V \times C_{SS}}{I_{SS}} \qquad \text{Equation 2}$$

If the load at node 1020 at start-up is predominantly bulk capacitance Cout 1016, then Vout at node 1020 will essentially track the rise of voltage on Css. As mentioned earlier, the pass FET is operated as a voltage follower during start-up; therefore, its gate-source voltage will essentially be constant during start-up, resulting in an approximately constant Cout charging current. The magnitude of this current can be calculated as follows:

$$I_{IN} = C_{OUT} \times \frac{dV_{OUT}}{dt} = C_{OUT} \times \frac{12V}{T_{SS}} \qquad \text{Equation 3}$$

From Equation 3, one can see that increasing Tss results in a reduction of the Cout charging current. In order to achieve successful start-up, the Css value is preferably selected in such a way that 12V×6 does not exceed the 240 VA protection threshold. Combining Equation 2 and Equation 3, one can derive a relationship between Css and Cout for a successful start-up.

$$C_{SS\_MIN} = I_{SS} \times \frac{C_{OUT}}{20A} \qquad \text{Equation 4}$$

If both capacitive and resistive load elements are present on the 12V output, the magnitude of Cout charging current can be calculated using Equation 5 (modified Equation 3).

$$I_{IN} = C_{OUT} \times \frac{12V}{T_{SS}} + \frac{12V}{T_{SS} \times R_{OUT}} \times t \qquad \text{Equation 5}$$

Combining Equation 2 and Equation 5, one can derive a relationship between Css and Cout for successful start-up (in case both capacitive and resistive load elements are present on the 12V output) (see Equation 6).

$$C_{SS\_MIN} = \frac{I_{SS} \times C_{OUT}}{20A - \frac{12V}{R_{OUT}}} \qquad \text{Equation 6}$$

In order to achieve reliable low loss operation of the pass FET, the integrated protection and monitoring device monitors the value of the gate-source voltage of the pass FET. By way of example, the gate-source voltage UVLO can be enabled approximately 400 ms after start-up initiation. This places an upper limit on Css and Tss.

If the pass FET gate-source voltage fails to go above the gate-source voltage UVLO threshold during start-up or falls below it anytime thereafter, the integrated protection and monitoring device can deem this a critical fault, latch the pass FET OFF and report a system fault condition. The latched fault condition can be kept until restart.

Figure 11:
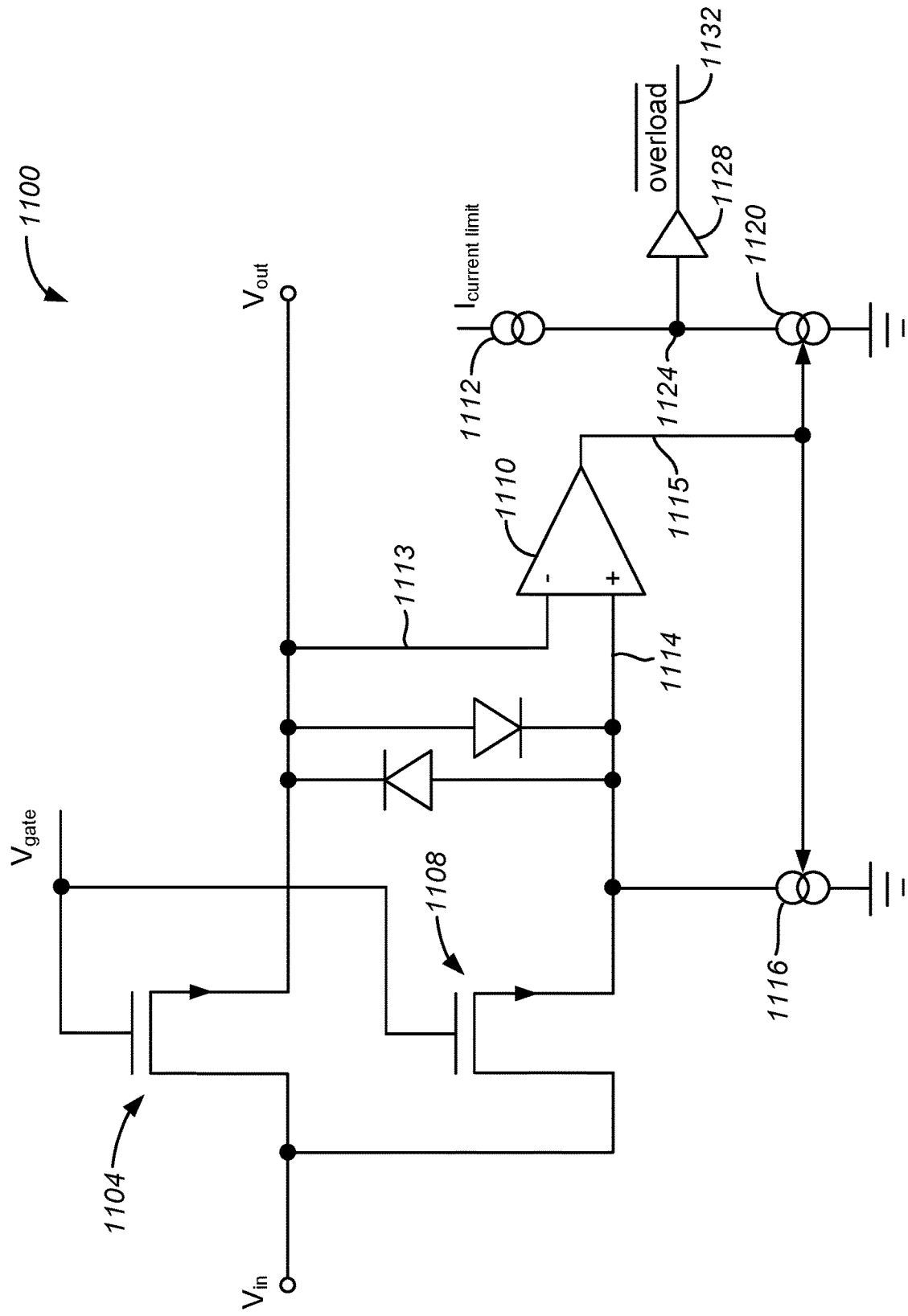
FIG. 11 is a simplified diagram of circuitry 1100 for performing current limiting, according to one or more embodiments of the invention.

Current limiting can be achieved using the circuitry 1100 of FIG. 11. In FIG. 11, circuitry 1100 represents one example of an integrated protection and monitoring device with a current monitoring mechanism providing over-current sensing and current reporting. In this example, voltage Vin is supplied to the integrated protection and monitoring device from a first component, such as a power source, and voltage Vout is provided from the integrated protection and monitoring device to a second component, such as a device to be powered. The circuitry 1100 includes a switching mechanism 1104 in the form of an N-MOSFET, in this example, and a reference N-MOSFET 1108, which is a scaled version of the N-MOSFET of switching mechanism 1104, as generally explained above with reference to FIG. 5. The circuitry 1100 is configured so that switching FET 1104 switches on or off to selectively allow current to pass between the first component and the second component, as generally described above. In this example, the configuration drives the current density of both switching FET 1104 and reference FET 1108 to be generally the same. In FIG. 11, the gates of the respective FETs 1104 and 1108 are coupled to each other, as are the drains of the respective FETs 1104 and 1108. An amplifier 1110 has a first input 1113 coupled to the source of switching FET 1104, a second input 1114 coupled to the source of reference FET 1108, and an output 1115 coupled to a current mirror described in greater detail below. This configuration of amplifier 1110 in conjunction with current source 1116 causes the voltages at the sources of both switching FET 1104 and reference FET 1108 to be equal.

In FIG. 11, a designated current threshold is implemented in the form of an adjustable reference current 1112, "$I_{current\ limit}$". In other implementations, the designated current threshold is a set reference current. In some embodiments, such as the example of FIG. 11, the reference current 1112 is scaled to maintain a power substantially near a power limiting threshold which is desirably not exceeded. For example, reference current 1112 can fluctuate in response to a changing input or output voltage level so that $I_{current\ limit}$*(Vin or Vout)=a desired power level of the component to be powered at the Vout node. For instance, if the desired power level is 240 VA, and Vin or Vout changes, the current threshold can be changed accordingly to maintain the 240 VA power level.

In FIG. 11, the current provided from the source of reference FET 1108 is a scaled fraction of the current provided at the source of switching FET 1104 and is mirrored using a current mirror mechanism having a simplified representation of a current source 1116 and a current source 1120 in this example. That is, the source current of reference FET 1108 is mirrored using the current mirror mechanism and provided to node 1124 and compared with the reference current 1112. In one implementation, the reference current 1112 is configured to provide a current value, which corresponds to a power threshold at which the switching mechanism is to be switched off at given a measured Vout. This can be done using different techniques. In an example of one technique, a power threshold, $P_{limit}$, can be set at 240 VA, and it is known that the integrated protection and monitoring device will be operating near 12V. Thus, a nominal voltage $V_{NOM}$ can be 12V, in this example. A current $I_{NOM}$ is $(P_{limit}/V_{NOM})$*(1/N), where N is the switching mechanism FET-to-reference FET ratio. $(V_{NOM}/Vout)*I_{NOM}=I_{current\ limit}$, where $I_{current\ limit}$ is thus the current representing the power level at which the switching mechanism is desirably shut off. In an example of a second technique, $I_{current\ limit}$ is calculated using an approximation. In particular, $I_{current\ limit}=I_{NOM}-K*(Vout-V_{NOM})$, which is relatively accurate when Vout is close to $V_{NOM}$. The constant, K, can be set based on calibration of the circuitry, and $K*(Vout-V_{NOM})$ is a correction term proportional to the difference between $V_{out}$ and $V_{NOM}$. This second technique can be used in implementations where it is desirable to subtract two signals than to divide them (e.g., using the first technique).

In FIG. 11, when the mirrored current provided by current source 1120 meets or exceeds the reference current 1112, both of which are provided to node 1124, a comparator 1128 having an input coupled to node 1124 outputs a current reporting signal indicating an overload condition at node 1132. In some alternative embodiments, the reference current 1112 and mirrored current from current source 1120 can be separately provided to respective resistors, to generate corresponding voltages. The outputs of the respective resistors can be coupled to a voltage comparator, so the voltages can be compared to determine whether the overload condition has occurred. In the various embodiments, the overload condition can be communicated to other devices and circuitry, such as controller 404 of FIG. 4A, to cause the switching mechanism to switch off. By the same token, when the reporting signal at node 1132 indicates that there is no longer an overload condition, controller 404 can cause the switching mechanism to switch on. Any of the various different switching mechanism implementations described herein can be controlled in these manners.

While the disclosed subject matter has been particularly shown and described with reference to specific embodiments thereof, it will be understood by those skilled in the art that changes in the form and details of the disclosed embodiments may be made without departing from the spirit or scope of the invention. The present invention should of course, not be limited to the depicted embodiments. In addition, although various advantages and aspects of the disclosed subject matter have been discussed herein with reference to various embodiments, it will be understood that the scope of the invention should not be limited by reference to such advantages and aspects. Rather, the scope of the invention should be determined with reference to the appended claims.

What is claimed is:

1. A device comprising:
    a switching mechanism capable of being coupled between a power supply and a device, the switching mechanism configured to have an on state in which the power supply is coupled to the device or an off state in which the power supply is de-coupled from the device, the on state allowing current to pass from the power supply to the device along a current path; and
    a controller including:
    a current measuring mechanism having one or more current sensing inputs coupled to sense a current at the current path, and
    a power measuring mechanism having: one or more current sensing inputs coupled to sense the current at the current path, and a voltage sensing input coupled to sense a voltage at a node between the switching mechanism and the device, the power measuring mechanism configured to measure a power based on the sensed current and the sensed voltage,
    the controller operatively coupled to cause the switching mechanism to have the off state in which the power supply is de-coupled from the device responsive to one or more events indicative of a system fault condition, the one or more events including the sensed current meeting or exceeding a current threshold and the measured power meeting or exceeding a designated power threshold, the current threshold being adjustable in relation to changes in the sensed voltage to maintain the designated power threshold, the controller integrated with the switching mechanism on a chip.

2. The device of claim 1, the chip being a flip chip.

3. The device of claim 1, the controller further having a temperature sensing input coupled to sense a temperature, the controller further operatively coupled to cause the switching mechanism to have the off state responsive to the one or more events including the sensed temperature exceeding a designated temperature threshold.

4. The device of claim 1, the power being measured using a scaled sensed current having a scale ratio with respect to the sensed current.

5. The device of claim 1, further comprising a reverse current switch coupled in series with the switching mechanism, the reverse current switch configured to have the on state or the off state.

6. The device of claim 5, the switching mechanism having a bulk connection, the reverse current switch having a reverse bulk connection.

7. A process comprising:
    sensing, using a current measuring mechanism, a current at a current path between a power supply and a device, a switching mechanism being coupled between the power supply and the device, the switching mechanism configured to have an on state in which the power supply is coupled to the device or an off state in which the power supply is de-coupled from the device, the on state allowing current to pass from the power supply to the device along the current path;
    sensing a voltage at a node between the switching mechanism and the device;
    measuring, using a power measuring mechanism, a power based on the sensed current and the sensed voltage; and
    controlling the switching mechanism to have the off state in which the power supply is de-coupled from the device responsive to the sensed current meeting or exceeding a current threshold and responsive to the measured power meeting or exceeding a designated power threshold, the current threshold being adjustable in relation to changes in the sensed voltage to maintain the designated power threshold.

8. The process of claim 7, further comprising:
comparing a first electrical characteristic sensed at the current path with a first threshold and a second threshold.

9. The process of claim 8, wherein the first threshold and the second threshold are adjustable.

10. The process of claim 8, further comprising:
determining that the sensed first electrical characteristic meets or exceeds the first threshold but does not meet or exceed the second threshold; and
sensing, responsive to the determination, a second electrical characteristic at the current path.

11. The process of claim 10, further comprising:
determining that the sensed second electrical characteristic meets or exceeds both the first threshold and the second threshold; and
causing, responsive to the determination, the switching mechanism to have the off state.

12. The process of claim 10, further comprising:
determining that the sensed second electrical characteristic does not exceed the second threshold; and
generating, responsive to the determination, a signal indicative of the sensed first electrical characteristic.

13. The process of claim 7, further comprising:
providing a reporting signal indicating the sensed current and the measured power.

14. The process of claim 7, wherein a designated time period passes between sensing the voltage and sensing the current.

15. The process of claim 14, wherein the time period is one of a plurality of selectable time periods.

16. The process of claim 14, wherein the time period is programmable.

17. The process of claim 14, wherein controlling the switching mechanism to have the off state includes:
causing the switching mechanism to have the off state after passing of the time period.

* * * * *